(12) United States Patent
Kwon et al.

(10) Patent No.: US 9,450,049 B2
(45) Date of Patent: Sep. 20, 2016

(54) SEMICONDUCTOR DEVICE AND METHOD FOR FABRICATING THE SAME

(71) Applicants: Tae-Yong Kwon, Suwon-si (KR); Sang-Su Kim, Yongin-si (KR); Jung-Gil Yang, Suwon-si (KR); Jung-Dal Choi, Hwaseong-si (KR)

(72) Inventors: Tae-Yong Kwon, Suwon-si (KR); Sang-Su Kim, Yongin-si (KR); Jung-Gil Yang, Suwon-si (KR); Jung-Dal Choi, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/276,421

(22) Filed: May 13, 2014

(65) Prior Publication Data
US 2014/0374797 A1    Dec. 25, 2014

(30) Foreign Application Priority Data
Jun. 24, 2013    (KR) .................. 10-2013-0072435

(51) Int. Cl.
| H01L 27/00 | (2006.01) |
| H01L 29/10 | (2006.01) |
| H01L 29/205 | (2006.01) |
| H01L 29/78 | (2006.01) |
| H01L 29/165 | (2006.01) |
| H01L 27/088 | (2006.01) |
| H01L 21/8238 | (2006.01) |
| H01L 21/84 | (2006.01) |
| H01L 29/66 | (2006.01) |
| H01L 27/092 | (2006.01) |
| H01L 27/12 | (2006.01) |

(52) U.S. Cl.
CPC ... H01L 29/1054 (2013.01); H01L 21/823821 (2013.01); H01L 21/845 (2013.01); H01L 27/088 (2013.01); H01L 27/0924 (2013.01); H01L 27/1211 (2013.01); H01L 29/165 (2013.01); H01L 29/205 (2013.01); H01L 29/6681 (2013.01); H01L 29/785 (2013.01); H01L 29/7842 (2013.01)

(58) Field of Classification Search
CPC ............ H01L 27/0605; H01L 27/088; H01L 29/1054; H01L 29/205; H01L 29/7842; H01L 29/165
USPC ........................................................ 257/190
See application file for complete search history.

(56) References Cited

U.S. PATENT DOCUMENTS

| 6,563,143 B2 * | 5/2003 | Gao et al. ...................... 257/190 |
| 7,037,770 B2 | 5/2006 | Chidambarrao et al. |
| 7,091,095 B2 | 8/2006 | Chu et al. |
| 7,504,311 B2 | 3/2009 | Koester et al. |
| 7,538,390 B2 | 5/2009 | Wang et al. |
| 7,642,140 B2 | 1/2010 | Bae et al. |
| 7,662,689 B2 | 2/2010 | Boyanov et al. |
| 7,993,998 B2 | 8/2011 | Chen et al. |
| 2003/0013323 A1 * | 1/2003 | Hammond ...... H01L 21/823807 438/770 |
| 2004/0171223 A1 | 9/2004 | Hammond et al. |
| 2006/0011983 A1 | 1/2006 | Fitzgerald |
| 2007/0138565 A1 * | 6/2007 | Datta et al. ................... 257/369 |

(Continued)

*Primary Examiner* — Marc Armand
*Assistant Examiner* — Quovaunda V Jefferson
(74) *Attorney, Agent, or Firm* — Lee & Morse, P.C.

(57) ABSTRACT

A semiconductor device includes a substrate, a compound semiconductor layer, and first and second semiconductor patterns. The substrate includes first and second regions. The first semiconductor pattern is on the compound semiconductor layer of the first region and includes an element semiconductor. The second semiconductor pattern is on the compound semiconductor layer of the second region and includes a Group III-V semiconductor material.

13 Claims, 15 Drawing Sheets

(56) References Cited

U.S. PATENT DOCUMENTS

| | | | |
|---|---|---|---|
| 2007/0231488 A1* | 10/2007 | Von Kaenel | 427/255.15 |
| 2009/0272965 A1* | 11/2009 | Rachmady | H01L 21/28273 257/24 |
| 2010/0109044 A1 | 5/2010 | Tekleab et al. | |
| 2010/0289116 A1* | 11/2010 | Lin et al. | 257/510 |
| 2012/0091528 A1 | 4/2012 | Chang et al. | |
| 2015/0228670 A1* | 8/2015 | Caimi | H01L 21/02532 257/351 |

\* cited by examiner

SEMICONDUCTOR DEVICE AND METHOD FOR FABRICATING THE SAME

CROSS-REFERENCE TO RELATED APPLICATION

Korean Patent Application No. 10-2013-0072435, filed on Jun. 24, 2013, and entitled, "Semiconductor Device And Method For Fabricating The Same," is incorporated by reference herein in its entirety.

BACKGROUND

1. Field

One or more embodiments described herein relate to a semiconductor device.

2. Description of the Related Art

Efforts are continually being made to reduce the size of transistors used in semiconductor devices. As transistor size decreases, gate and channel lengths decrease proportionally. This, in turn, increases the scattering of charges in the channel and produces a decrease in charge mobility. Decreased charge mobility serves as an impediment to improving transistor saturation current.

SUMMARY

In accordance with one embodiment, a semiconductor device includes a substrate including a first region and a second region; a compound semiconductor layer on the substrate; a first semiconductor pattern on the compound semiconductor layer of the first region, the first semiconductor pattern including an element semiconductor; and a second semiconductor pattern on the compound semiconductor layer of the second region, the second semiconductor pattern including a Group III-V semiconductor material.

The semiconductor device may include a first buffer pattern between the compound semiconductor layer and the second semiconductor pattern, wherein the first buffer pattern includes a Group III-V semiconductor material. The semiconductor device may include a second buffer pattern between the compound semiconductor layer and the first buffer pattern, wherein the second buffer pattern and the first buffer pattern include different materials. The second buffer pattern may include an element semiconductor.

The semiconductor device may include a buffer pattern between the compound semiconductor layer and the second semiconductor pattern, wherein the buffer pattern includes an element semiconductor. The buffer pattern and the first semiconductor pattern may be formed at a same level.

The semiconductor device may include a capping pattern on the second semiconductor pattern. The capping pattern may include a Group III-V semiconductor material. The capping pattern may include a first energy band gap, and the second semiconductor pattern may include a second energy band gap which is less than the first energy band gap.

The semiconductor device may include a first insertion pattern between the first semiconductor pattern and the compound semiconductor layer. The semiconductor device may include a second insertion pattern between the compound semiconductor layer and the second semiconductor pattern, wherein the first insertion pattern and the second insertion pattern are at a same level. Each of the first insertion pattern and the second insertion pattern may include a material having an etching selectivity relative to the first semiconductor pattern.

The semiconductor device may include an insertion layer on the compound semiconductor layer, wherein the first semiconductor pattern and the second semiconductor pattern are on the insertion layer. The substrate may be a silicon substrate, and the first semiconductor pattern may include germanium. The compound semiconductor layer may include a silicon-germanium layer. The first region may include a P-type transistor region, and the second region may include an N-type transistor region.

In accordance with another embodiment, a semiconductor device includes a silicon substrate including a first region and a second region; a compound semiconductor layer on the silicon substrate; a first transistor on the compound semiconductor layer in the first region; and a second transistor on the compound semiconductor layer in the second region, wherein the first transistor includes a germanium channel layer on the compound semiconductor layer and a first gate electrode on and crossing the germanium channel layer, and wherein the second transistor includes a first buffer pattern including germanium on the compound semiconductor layer, a Group III-V semiconductor channel layer including a first Group III-V semiconductor material on the first buffer pattern, and a second gate electrode crossing the Group III-V semiconductor channel layer on the Group III-V semiconductor channel layer.

The first transistor may include a first insertion pattern between the germanium channel layer and the compound semiconductor layer, the second transistor may include a second insertion pattern between the first buffer pattern and the Group III-V semiconductor channel layer, and the first insertion pattern and the second insertion pattern may be at a same level. The first buffer pattern and at least a part of the germanium channel layer may be at a same level. Each of the first insertion pattern and the second insertion pattern may include a material having an etching selectivity relative to germanium.

The semiconductor device may include a second buffer pattern between the Group III-V semiconductor channel layer and the first buffer pattern, wherein the second buffer pattern includes a second Group III-V semiconductor material having an energy band gap greater than an energy band gap of the first Group III-V semiconductor material.

The semiconductor device may include a capping pattern between the Group III-V semiconductor channel layer and the second gate electrode, wherein the capping pattern includes a third Group III-V semiconductor material having an energy band gap greater than an energy band gap of the first Group III-V semiconductor.

In accordance with another embodiment, a semiconductor device includes a substrate; a compound semiconductor layer on the substrate; a first fin-type active pattern on the compound semiconductor layer and including a germanium channel layer; a second fin-type active pattern on the compound semiconductor layer spaced from the first fin-type active pattern, the second fin-type active pattern including a Group III-V semiconductor channel layer which includes a first Group III-V semiconductor; a first gate electrode crossing the first fin-type active pattern; and a second gate electrode crossing the second fin-type active pattern.

The semiconductor device may include a buffer pattern between the Group III-V semiconductor channel layer and the compound semiconductor layer, wherein the buffer pattern includes a second Group III-V semiconductor having an energy band gap larger than an energy band gap of the first Group III-V semiconductor.

The semiconductor device may include a buffer pattern between the Group III-V semiconductor channel layer and the compound semiconductor layer, wherein the buffer pattern includes a germanium element semiconductor.

In accordance with another embodiment, a semiconductor device includes a substrate; a buffer layer on the substrate; and a semiconductor pattern on the buffer layer, wherein the substrate has a first lattice constant, the buffer layer has a second lattice constant, and the semiconductor pattern has a third lattice constant, and wherein the second lattice constant is between the first and second lattice constants. The second lattice constant may be greater than the first lattice constant of the substrate and less than the third lattice constant.

The semiconductor pattern may have biaxial compressive stress based on a difference between the second and third lattice constants. The buffer layer may have a thickness that is less than or equal to critical thickness. The buffer layer may include a first region over a second region, and the first region may have a defect density less than the second region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
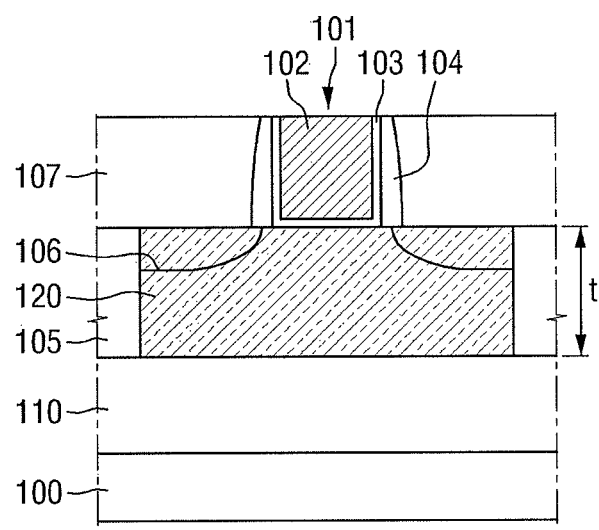
FIG. 1 illustrates a first embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
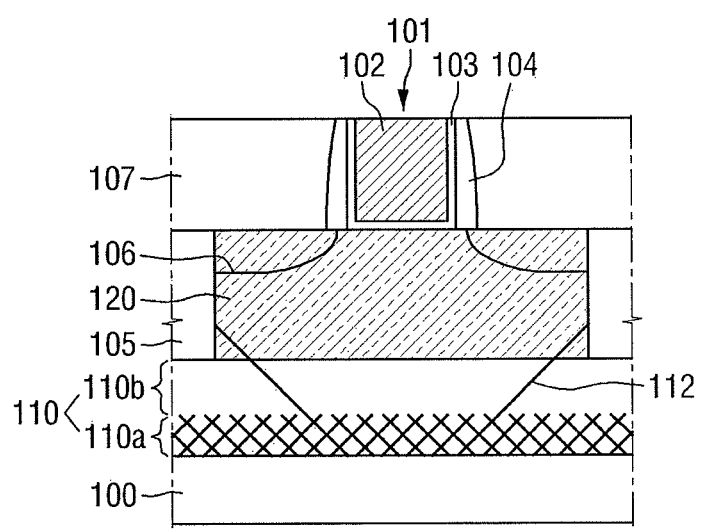
FIG. 2 illustrates a function of a first strain relaxed buffer layer in FIG. 1.

FIG. 1 illustrates a first embodiment of a semiconductor device, and FIG. 2 illustrates an example of a function of a first strain relaxed buffer layer in FIG. 1. The semiconductor devices in these figures may be p-type transistors. In other embodiments, n-type transistors may be implemented.

Referring to FIG. 1, semiconductor device 1 includes a substrate 100, a first strain relaxed buffer layer 110, a first insulating layer pattern 105, a first semiconductor pattern 120, and a first gate pattern 101. The substrate 100 may be made of bulk silicon. Alternatively, substrate 100 may be a silicon substrate or a silicon-on-insulator (SOI) substrate. In the illustrated embodiment, substrate 100 is a silicon substrate.

The first strain relaxed buffer layer 110 is formed on the substrate 100. The first strain relaxed buffer layer 110 may include a compound semiconductor. That is, the first strain relaxed buffer layer 110 may be a compound semiconductor layer. The first strain relaxed buffer layer 110 may include, for example, a Group IV-IV compound semiconductor or a Group III-V compound semiconductor. As an example of a Group IV-IV compound semiconductor, the first strain relaxed buffer layer 110 may be a binary compound such as silicon germanium including at least two of carbon (C), silicon (Si), germanium (Ge), and tin (Sn), a ternary compound, or a compound in which Group IV elements are doped in the binary compound or the ternary compound.

As an example of a Group III-V compound semiconductor, the first strain relaxed buffer layer 110 may be one of a binary compound, a ternary compound, or a quaternary compound which is formed by coupling at least one of aluminum (Al), gallium (Ga), and indium (In) as Group III elements and one of phosphorus (P) and arsenic (As) as Group V elements.

The first strain relaxed buffer layer 110 is illustrated as a single layer. In an alternative embodiment, first strain relaxed buffer layer 110 may include a plurality of layers. Also, in FIG. 1, the first strain relaxed buffer layer 110 is shown as one layer located relatively far away from substrate 100. Alternatively, first strain relaxed buffer layer 110 may include a plurality of layers having, for example, different lattice constants.

The first strain relaxed buffer layer 110 may have a crystal structure similar to the substrate 100. In the semiconductor device 1, substrate 100 is a silicon substrate having a diamond crystal structure. Accordingly, the first strain relaxed buffer layer 110 may include a compound semiconductor having a zinc-blende structure similar to the diamond crystal structure.

The first semiconductor pattern 120 is formed on the first strain relaxed buffer layer 110. The first semiconductor pattern 120 may include an element semiconductor material, for example, germanium. In other words, the first semiconductor pattern 120 may be a germanium element semiconductor pattern. The first semiconductor pattern 120 may be a single crystal layer grown on the first strain relaxed buffer layer 110, for example, by an epitaxial growth method. In one embodiment, the semiconductor pattern 120 may be formed of an "element semiconductor," e.g., a semiconductor constituted by a single element.

The first semiconductor pattern 120 may be used as a channel layer in the semiconductor device 1. That is, the first semiconductor pattern 120 may be used as a channel region of the transistor.

A thickness t of the first semiconductor pattern 120 on the first strain relaxed buffer layer 110 may be less than or equal to a critical thickness of the first semiconductor pattern 120. When the thickness t of the first semiconductor pattern 120 is the critical thickness or less, the first semiconductor pattern 120 on the first strain relaxed buffer layer 110 may be, for example, in a fully-strained state.

The critical thickness of a thin film may be determined based on a difference between a lattice constant of a mother substrate and a lattice constant of a material formed as a thin film. Therefore, as the difference between a lattice constant of the first strain relaxed buffer layer 110 and the lattice constant of the first semiconductor pattern 120 is decreased, the thickness t of the first semiconductor pattern 120 grown in the fully-strained state is increased.

The first insulating layer pattern 105 is formed on the first strain relaxed buffer layer 110. The first insulating layer pattern 105 is formed in the first semiconductor pattern 120. That is, the first semiconductor pattern 120 may be defined by the first insulating layer pattern 105. A bottom of the first insulating layer pattern 105 may be positioned on a boundary between the first strain relaxed buffer layer 110 and the first semiconductor pattern 120. In other embodiments, the first insulating layer may be at another location. The first insulating layer pattern 105 may include, for example, at least one of silicon oxide, silicon nitride, or silicon oxynitride.

An upper surface of the first insulating layer pattern 105 and an upper surface of the first semiconductor pattern 120 may be disposed, for example, on the same plane. That is, as illustrated in a first region I of FIG. 8, part of the first semiconductor pattern 120 may protrude from the first insulating layer pattern 105. In other words, the first semiconductor pattern 120 may have a fin-type active pattern shape, and first insulating layer pattern 105 may cover a lower portion of the first semiconductor pattern 120.

The first gate pattern 101 is formed on the first semiconductor pattern 120. The first gate pattern 101 may include a first gate insulating layer 103, a first gate electrode 102, and a first spacer 104.

The first gate insulating layer 103 may include, for example, a silicon oxide layer or a high dielectric layer. The high dielectric layer may include one or more of, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and lead scandium tantalum oxide, or lead zinc niobate.

The first gate electrode 102 may include, for example, polysilicon or metallic material. The first spacer 104 may include, for example, silicon oxide, silicon nitride, or silicon oxynitride. In FIG. 1, the first gate electrode 102 and the first gate insulating layer 103 are formed in a trench in an interlayer insulating layer 107.

First source/drain 106 are formed at respective sides of the first gate pattern 101, and may be formed in the first semiconductor pattern 120. In one embodiment, the first source/drain 106 are formed by doping a p-type impurity in the first semiconductor pattern 120. That is, the first source/drain 106 and part of first semiconductor pattern 120 are removed, and thereafter re-grown using an epitaxial growth method to form the first source/drain 106.

In FIG. 1, the substrate 100 may have a first lattice constant, the first strain relaxed buffer layer 110 may have a second lattice constant, and the first semiconductor pattern 120 may have a third lattice constant. In one embodiment, the second lattice constant of the first strain relaxed buffer layer 110 is larger than the first lattice constant of substrate 100, and smaller than the third lattice constant of the first semiconductor pattern 120.

The lattice constant of the first strain relaxed buffer layer 110 may have a value between the lattice constant of the substrate 100 and the lattice constant of the first semiconductor pattern 120. Accordingly, the first semiconductor pattern 120 on the first strain relaxed buffer layer 110 is formed to have a small strain, compared to the case where first semiconductor pattern 120 is formed directly on the substrate 100.

Further, from the viewpoint of critical thickness, the first semiconductor pattern 120 on the first strain relaxed buffer layer 110 may be formed to be thicker in the strained state compared with a case where the first semiconductor pattern 120 is formed directly on the substrate 100. Since buffer layer 110 has a smaller lattice constant than the first semiconductor pattern 120, the first semiconductor pattern 120 receives biaxial stress from the first strain relaxed buffer layer 110. That is, since the first semiconductor pattern 120 receives biaxial compressive stress from the first strain relaxed buffer layer 110 located therebelow, hole mobility in the first semiconductor pattern 120 is improved.

A lattice constant relationship among the substrate 100, the first strain relaxed buffer layer 110, and the first semiconductor pattern 120 will be described as an example. In one embodiment, the substrate 100 is a silicon substrate and the first semiconductor pattern 120 is a germanium element semiconductor pattern having a lattice constant larger than silicon. The first strain relaxed buffer layer 110 may include a silicon germanium layer. Since the silicon germanium layer is a compound of silicon and germanium, the first strain relaxed buffer layer 110 has a lattice constant larger than the substrate 100 and a lattice constant less than the first semiconductor pattern 120.

When the silicon germanium layer in the first strain relaxed buffer layer 110 is $Si_{0.3}Ge_{0.7}$, a critical thickness of the first semiconductor pattern 120 epitaxially grown on the first strain relaxed buffer layer 110 may be about 100 nm. That is, on the first strain relaxed buffer layer 110 having a composition of $Si_{0.3}Ge_{0.7}$, a germanium element semiconductor pattern of 100 nm or less in a fully-strained state may be grown.

FIG. 2 illustrates one approach for improving defect density in the first semiconductor pattern 120. Referring to FIG. 2, the first strain relaxed buffer layer 110 may include a first portion 110a adjacent to the substrate 100 and a second portion 110b adjacent to the first semiconductor pattern 120.

The first portion 110a of the first strain relaxed buffer layer may include many defects generated between the first strain relaxed buffer layer 110 and the substrate 100. These defects may be caused by lattice mismatch between the substrate 100 and the first strain relaxed buffer layer 110. However, a second portion 110b of the first strain relaxed buffer layer may include only some defects which are not terminated in the first portion 110a of the first strain relaxed buffer layer, among defects generated between the first strain relaxed buffer layer 110 and the substrate 100. That is, defect density of the second portion 110b of the first strain relaxed buffer layer may be less than defect density of the first portion 110a of the first strain relaxed buffer layer.

When the defects caused by lattice mismatch between substrate 100 and first strain relaxed buffer layer 110 meets a defect propagated in one direction and then propagated in another direction, the propagation of defects may be interrupted. As a result of such a mechanism, in the first portion 110a of the first strain relaxed buffer layer adjacent to substrate 100, most of the defects generated between the first strain relaxed buffer layer 110 and the substrate 100 may be terminated.

A defect 112 which is not terminated in the first portion 110a of the first strain relaxed buffer layer passes through the second portion 110b of the first strain relaxed buffer layer and then may propagate to the first semiconductor pattern 120. However, the defect 112 which is not terminated in the first portion 110a of the first strain relaxed buffer layer but which propagates to the first semiconductor pattern 120 may also be terminated by the first insulating layer pattern 105, which contacts the first semiconductor pattern 120. Accordingly, the defect generated between the first strain relaxed buffer layer 110 and the substrate 100 may not propagate to the upper portion of the first semiconductor pattern 120, which may correspond to the channel region of the transistor.

In the first portion 110a of the first strain relaxed buffer layer, the second portion 110b of the first strain relaxed buffer layer may have a lattice constant of the compound semiconductor of the first strain relaxed buffer layer 110. This is because stress concentration due to lattice mismatch between the first strain relaxed buffer layer 110 and the substrate 100 is removed as a result of the defect.

Since the first strain relaxed buffer layer 110 and the first semiconductor pattern 120 have different lattice constants, a defect between the first strain relaxed buffer layer 110 and the first semiconductor pattern 120 may be generated. However, because the first semiconductor pattern 120 may be grown to a critical thickness or less, the defect caused by lattice mismatch between the first semiconductor pattern 120 and the first strain relaxed buffer layer 110 may not be generated or may only be slightly generated.

As a result of such a defect removing mechanism, the first semiconductor pattern 120 on the first strain relaxed buffer layer 110 may have high crystal quality.

Figure 3A:
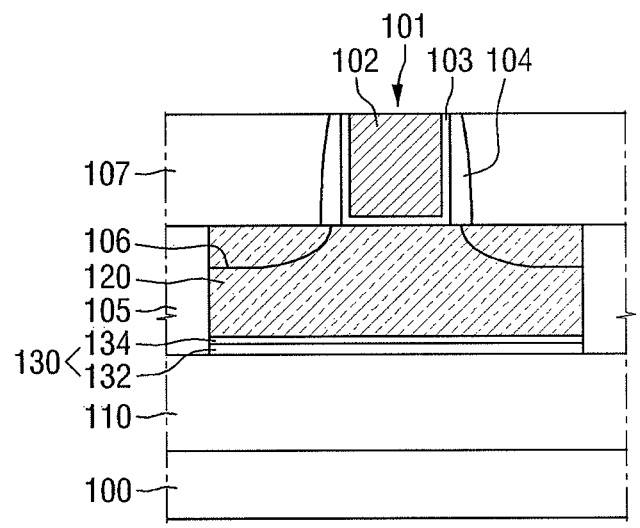
FIG. 3A illustrates a second embodiment of a semiconductor device.
Figure 3B:
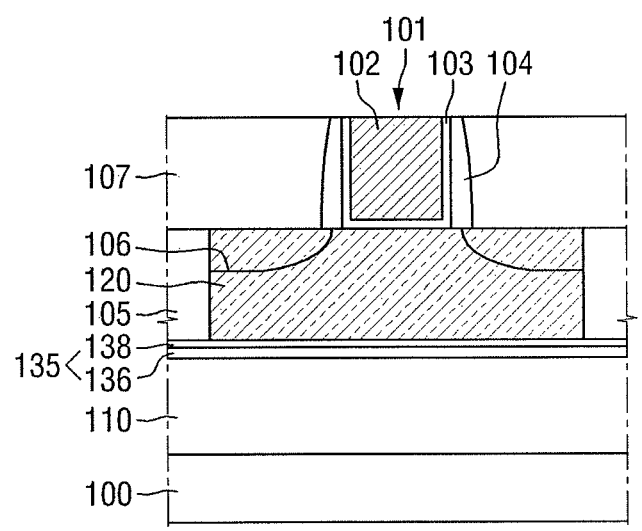
FIG. 3B illustrates a modified example of the semiconductor device in FIG. 3A.

FIG. 3A illustrates a second embodiment of a semiconductor device, and FIG. 3B illustrates a modified example of the semiconductor device in FIG. 3A. The semiconductor device according to the second embodiment is substantially the same as the first embodiment, except for the inclusion of an insertion pattern.

Referring to FIG. 3A, a semiconductor device 2 includes a substrate 100, a first strain relaxed buffer layer 110, a first insulating layer pattern 105, a first semiconductor pattern 120, a first insertion pattern 130, and a first gate pattern 101. The first strain relaxed buffer layer 110 is formed on substrate 100, and the first semiconductor pattern 120 is formed on the first strain relaxed buffer layer 110.

The first strain relaxed buffer layer 110 includes a compound semiconductor having a greater lattice constant than the substrate 100. Further, the lattice constant of the first strain relaxed buffer layer 110 is less than a lattice constant of the first semiconductor pattern 120.

The first insertion pattern 130 is formed between the first semiconductor pattern 120 and the first strain relaxed buffer layer 110. The first insertion pattern 130 includes a first lower insertion pattern 132 and a first upper insertion pattern 134.

The first lower insertion pattern 132 may include an element semiconductor, for example, germanium. The first upper insertion pattern 134 includes a material having a high etching selectivity to the first semiconductor pattern 120. In one embodiment, the first upper insertion pattern 134 includes a ternary compound constituted by Group IV elements or a Group III-V compound semiconductor, for example, SiGeC, GaAs, or AlAs. According to one example, the first upper insertion pattern 134 may include a material having a high etching selectivity to a germanium element semiconductor included in the first semiconductor pattern 120.

The first insulating layer pattern 105 on the first strain relaxed buffer layer 110 is formed in the first semiconductor pattern 120 and the first insertion pattern 130. In one example implementation, the first insulating layer pattern 105 is formed to pass through the first semiconductor pattern 120 and the first insertion pattern 130.

Referring to FIG. 3B, a first insertion layer 135 is formed between the first semiconductor pattern 120 and the first strain relaxed buffer layer 110. The first insertion layer 135 includes a first lower insertion layer 136 and a first upper insertion layer 138. The first lower insertion layer 136 may include germanium, and the first upper insertion layer 138 may include a material having a high etching selectivity to the first semiconductor pattern 120.

The first insulating layer pattern 105 is formed on the first strain relaxed buffer layer 110 and the first insertion layer 135, which may be sequentially laminated. In the modified example of FIG. 3B, the first insulating layer pattern 105 passes through the first semiconductor pattern 120 but does not pass through the first insertion layer 135. According to this arrangement, a bottom of the first insulating layer pattern 105 may be positioned on a boundary between the first semiconductor pattern 120 and the first insertion layer 135.

Figure 4:
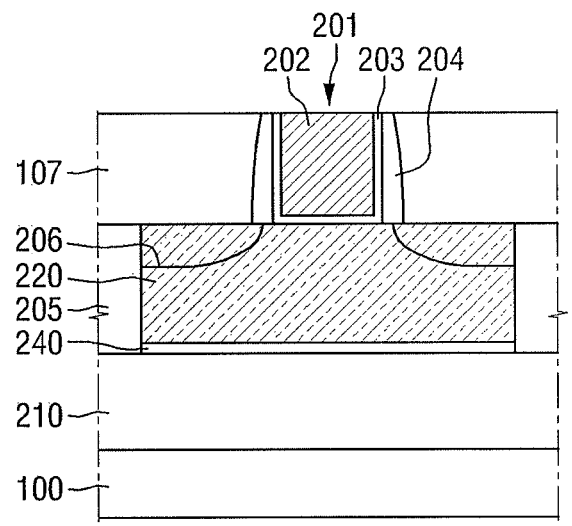
FIG. 4 illustrates a third embodiment of a semiconductor device.

FIG. 4 illustrates a third embodiment of a semiconductor device 3 which includes a substrate 100, a second strain relaxed buffer layer 210, a second insulating layer pattern 205, a first buffer pattern 240, a second semiconductor pattern 220, and a second gate pattern 201. This semiconductor device 3 may correspond to an N-type transistor, as is also the case with semiconductor devices 4 to 6 to be described with reference to FIGS. 5 to 7B.

The second strain relaxed buffer layer 210 is formed on the substrate 100. The second strain relaxed buffer layer 210 may include a compound semiconductor, for example, a Group IV-IV compound semiconductor or a Group III-V compound semiconductor. A lattice constant of the second strain relaxed buffer layer 210 is less than a lattice constant of the substrate 100. In one embodiment, second strain relaxed buffer layer 210 may be substantially the same as first strain relaxed buffer layer 110.

The first buffer pattern 240 is formed on the second strain relaxed buffer layer 210. The first buffer pattern 240 may include an element semiconductor, for example, germanium. In other words, the first buffer pattern 240 may be a germanium pattern. A lattice constant of the first buffer pattern 240 may be less than a lattice constant of the second strain relaxed buffer layer 210. The first buffer pattern 240 may be a layer which is grown by an epitaxial growth method on the second strain relaxed buffer layer 210.

The first buffer pattern 240 may serve as a strain buffer, which reduces a degree of lattice mismatch between the second semiconductor pattern 220 and the second strain relaxed buffer layer 210 in a manner to be described in greater detail below.

The second semiconductor pattern 220 is formed on the first buffer pattern 240. The second semiconductor pattern 220 may include a second Group III-V semiconductor, for example, may be one of binary compounds or ternary compounds formed by coupling at least one of aluminum (Al), gallium (Ga), or indium (In) as Group III elements with one of phosphorus (P), arsenic (As), or antimony (Sb) as Group V elements. Although pattern 220 may be formed by a fabricating method, the second semiconductor pattern 220 may be a single crystal layer grown on the first buffer pattern 240 by an epitaxial growth method.

The substrate 100 may have a first lattice constant, and the second strain relaxed buffer layer 210 may have a second lattice constant which is the same or substantially equal to the first strain relaxed buffer layer 110 in FIG. 1. The second semiconductor pattern 220 may have a fourth lattice constant. In semiconductor device 3, the second lattice constant of the second strain relaxed buffer layer 210 is greater than the first lattice constant of the substrate 100, and less than the fourth lattice constant of the second semiconductor pattern 220.

The second semiconductor pattern 220 may be used as the channel layer in the semiconductor device 3. For example, the second semiconductor pattern 220 may be used as a channel region of the transistor.

The second insulating layer pattern 205 is formed on the second strain relaxed buffer layer 210, and may be formed between the second semiconductor pattern 220 and the first buffer pattern 240. That is, the second semiconductor pattern 220 and the first buffer pattern 240 may be defined by the second insulating layer pattern 205. A bottom of the second insulating layer pattern 205 is positioned on a boundary between the second strain relaxed buffer layer 210 and the first buffer pattern 240, but this is not necessary. The second insulating layer pattern 205 may include, for example, at least one of silicon oxide, silicon nitride, or silicon oxynitride.

An upper surface of the second insulating layer pattern 205 and an upper surface of the second semiconductor pattern 220 may be disposed on the same plane, but this is not necessary. As illustrated in second region II of FIG. 8, the second semiconductor pattern 220 may have a fin-type active pattern shape which protrudes from the second insulating layer pattern 205.

The second gate pattern 201 is formed on the second semiconductor pattern 220. The second gate pattern 201 may include a second gate insulating layer 203, a second gate electrode 202, and a second spacer 204. The second gate pattern 201 may be the same or substantially similar to the first gate pattern 101 in FIG. 1.

Second source/drain regions 206 are formed at respective sides of second gate pattern 201, and may be formed in the second semiconductor pattern 220. The second source/drain regions 206 may be formed by doping an impurity (e.g., n-type or p-type) in the second semiconductor pattern 220. The impurity doped in the second semiconductor pattern 220 may be, for example, silicon.

In this embodiment as well as other embodiments, defect density in the second semiconductor pattern 220 on the second strain relaxed buffer layer 210 may be improved. For example, at a portion of the second strain relaxed buffer layer adjacent to the substrate 100, most of defects generated between the second strain relaxed buffer layer 210 and the substrate 100 may be terminated. A defect which is not terminated at the second strain relaxed buffer layer but which propagates to the second semiconductor pattern 220 may be terminated by the second insulating layer pattern 205 contacting the second semiconductor pattern 220.

Further, the first buffer pattern 240 reduces lattice mismatch between the second semiconductor pattern 220 and the second strain relaxed buffer layer 210. That is, the first buffer pattern 240 reduces the density of defects which may be generated between the second semiconductor pattern 220 and the second strain relaxed buffer layer 210. In this embodiment, the second semiconductor pattern 220 formed on the second strain relaxed buffer layer 210 may have high crystal quality.

Figure 5:
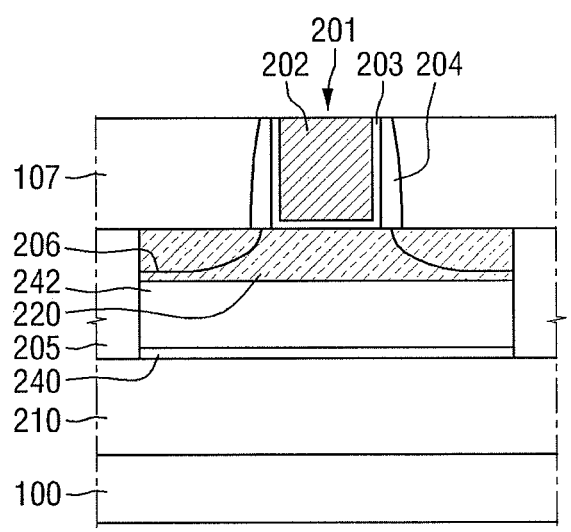
FIG. 5 illustrates a fourth embodiment of a semiconductor device.

FIG. 5 illustrates a fourth embodiment of a semiconductor device 4 which includes a substrate 100, a second strain relaxed buffer layer 210, a second insulating layer pattern 205, a first buffer pattern 240, a second buffer pattern 242, a second semiconductor pattern 220, and a second gate pattern 201. Semiconductor device 4 may be similar to the third embodiment except as follows.

The second buffer pattern 242 is formed between the first buffer pattern 240 and the second semiconductor pattern 220. The second buffer pattern 242 may include a compound semiconductor, and for example, a first Group III-V semiconductor. The second buffer pattern 242 may be, for example, one of binary compounds or ternary compounds which are formed by coupling at least one of aluminum (Al), gallium (Ga), or indium (In) as Group III elements with one of phosphorus (P), arsenic (As), or antimony (Sb) as Group V elements.

The first Group III-V semiconductor in the second buffer pattern 242 may include a different material from the second Group III-V semiconductor in the second semiconductor pattern 220. Alternatively, the first Group III-IV semiconductor may have a different composition even though the first Group III-V semiconductor includes the same material as the second Group III-V semiconductor.

An energy band gap of the first Group III-V semiconductor included in the second buffer pattern 242 may be a first energy band gap. An energy band gap of the second Group III-V semiconductor in the second semiconductor pattern 220 may be a second energy band gap. The first energy band gap may be greater than the second energy band gap. The second buffer pattern 242 having the first energy band gap and the second semiconductor pattern 220 having the second energy band gap less than the first energy band gap may be sequentially laminated on the first buffer pattern 240.

The first buffer pattern 240 and the second buffer pattern 242 are interposed between the second strain relaxed buffer layer 210 and the second semiconductor pattern 220. As a result, the lattice mismatch between the second semiconductor pattern 220 and the second strain relaxed buffer layer 210 may be further decreased.

Figure 6:
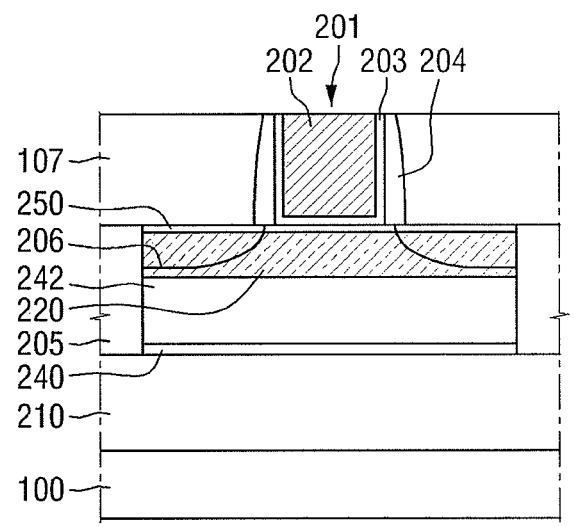
FIG. 6 illustrates a fifth embodiment of a semiconductor device.

FIG. 6 illustrates a fifth embodiment of a semiconductor device 5 which includes a substrate 100, a second strain relaxed buffer layer 210, a second insulating layer pattern 205, a first buffer pattern 240, a second buffer pattern 242, a second semiconductor pattern 220, a capping pattern 250, and a second gate pattern 201. Semiconductor device 5 may be similar to the fourth embodiment, except as follows.

The capping pattern 250 is formed between the second semiconductor pattern 220 and the second gate pattern 201. The capping pattern 250 may include a compound semiconductor, for example, a third Group III-V semiconductor. The capping pattern 250 may be, for example, one of binary compounds or ternary compounds which are formed by coupling at least one of aluminum (Al), gallium (Ga), or indium (In) as Group III elements with one of phosphorus (P), arsenic (As), or antimony (Sb) as Group V elements.

The third Group III-V semiconductor in capping pattern 250 may include a material different from the second Group III-V semiconductor in the second semiconductor pattern 220. Alternatively, the third Group III-V semiconductor may have a different composition even though the third Group III-V semiconductor includes the same material as the second Group III-V semiconductor.

An energy band gap of the first Group III-V semiconductor in the second buffer pattern 242 may be a first energy band gap An energy band gap of the second Group III-V semiconductor in the second semiconductor pattern 220 may be a second energy band gap. An energy band gap of the third Group III-V semiconductor in the capping pattern 250 may be a third energy band gap. The second energy band gap may be greater than the first energy band gap and the third energy band gap. The energy band gap of the second semiconductor pattern 220 interposed between the second buffer pattern 242 and the capping pattern 250 may be the least.

From the viewpoint of the energy band gap, the second buffer pattern 242 having the first energy band gap and the capping pattern 250 having the third energy band gap are positioned on and below the second semiconductor pattern 220 having the second energy band gap. As a result, a quantum well may be formed at the second semiconductor pattern 220. Because the quantum well may define a passage through which charges may move in the channel region of the transistor, the quantum well may help the charges to move more easily in the second semiconductor pattern 220.

Also, in the semiconductor device according to the fifth embodiment, the second buffer pattern 242 may be formed between the second semiconductor pattern 220 and the first buffer pattern 240, but this is not necessary. According to one example, the second buffer pattern 242 may not be interposed between the second semiconductor pattern 220 and the first buffer pattern 240.

Figure 7A:
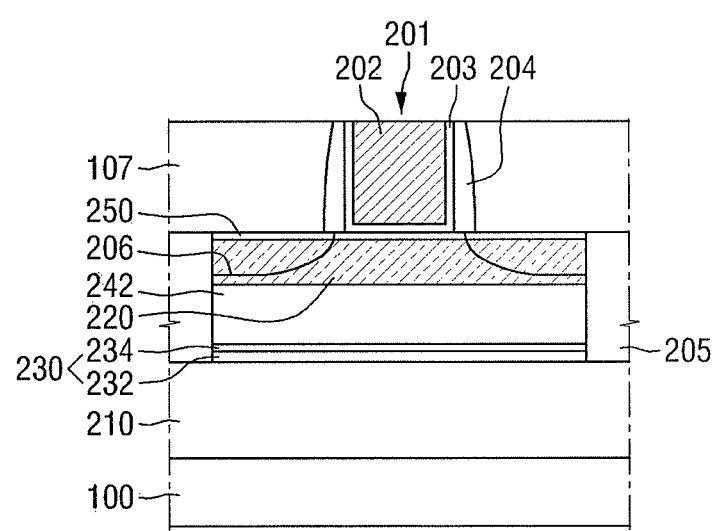
FIG. 7A illustrates a sixth embodiment of a semiconductor device.
Figure 7B:
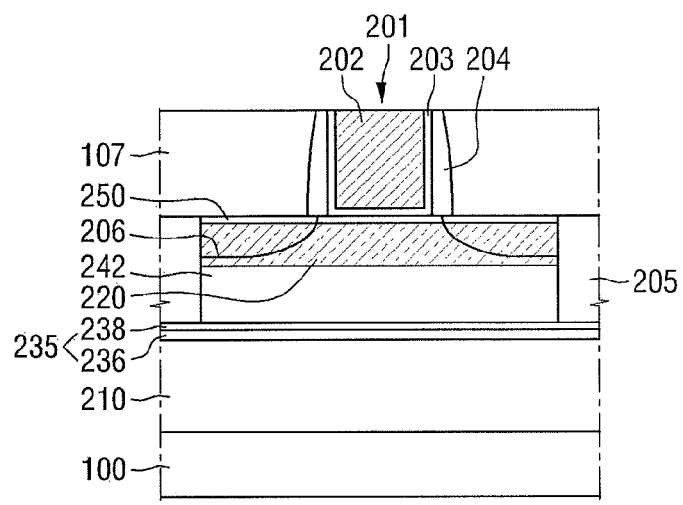
FIG. 7B illustrates a modified example of the semiconductor device in FIG. 7A.

FIG. 7A illustrates a sixth embodiment of a semiconductor device 6. This embodiment is similar to the fifth embodiment, except that a second insertion pattern is included in the first buffer pattern. FIG. 7B illustrates a modified example of the semiconductor device in FIG. 7A.

Referring to FIG. 7A, semiconductor device 6 includes a substrate 100, a second strain relaxed buffer layer 210, a second insulating layer pattern 205, a second insertion pattern 230, a second buffer pattern 242, a second semiconductor pattern 220, a capping pattern 250, and a second gate pattern 201.

The second insertion pattern 230 is formed between the second buffer pattern 242 and the second strain relaxed buffer layer 210. The second insertion pattern 230 includes a second lower insertion pattern 232 and a second upper insertion pattern 234.

The second lower insertion pattern 232 may include an element semiconductor, for example, germanium. The second upper insertion pattern 234 includes a material having a high etching selectivity to the second lower insertion pattern 232. The second upper insertion pattern 234 may include a ternary compound of Group IV elements or Group III-V compound semiconductor, for example, SiGeC, GaAs, or AlAs.

The second insulating layer pattern 205 on the second strain relaxed buffer layer 210 passes through the capping pattern 250, the second semiconductor pattern 220, the second buffer pattern 242, and the second insertion pattern 230 to be formed in the capping pattern 250, the second semiconductor pattern 220, the second buffer pattern 242, and the second insertion pattern 230.

Referring to FIG. 7B, a second insertion layer 235 is formed between the second buffer pattern 242 and the second strain relaxed buffer layer 210. The second insertion layer 235 includes a second lower insertion layer 236 and a second upper insertion layer 238. The second lower insertion layer 236 may include germanium. The second upper insertion layer 238 may include a material having a high etching selectivity to the second lower insertion layer 236.

In the modified example of semiconductor device 6, the second insulating layer pattern 205 passes through the second buffer pattern 242, but does not pass through the second insertion layer 235. That is, a bottom of the second insulating layer pattern 205 may be positioned on a boundary between the second buffer pattern 242 and the second insertion layer 235.

In FIGS. 7A and 7B, the capping pattern 250 and the second buffer pattern 242 may be positioned on and below the second semiconductor pattern 220, respectively, but this is not necessary. That is, the capping pattern 250 and/or the second buffer pattern 242 may not be formed.

Figure 8:
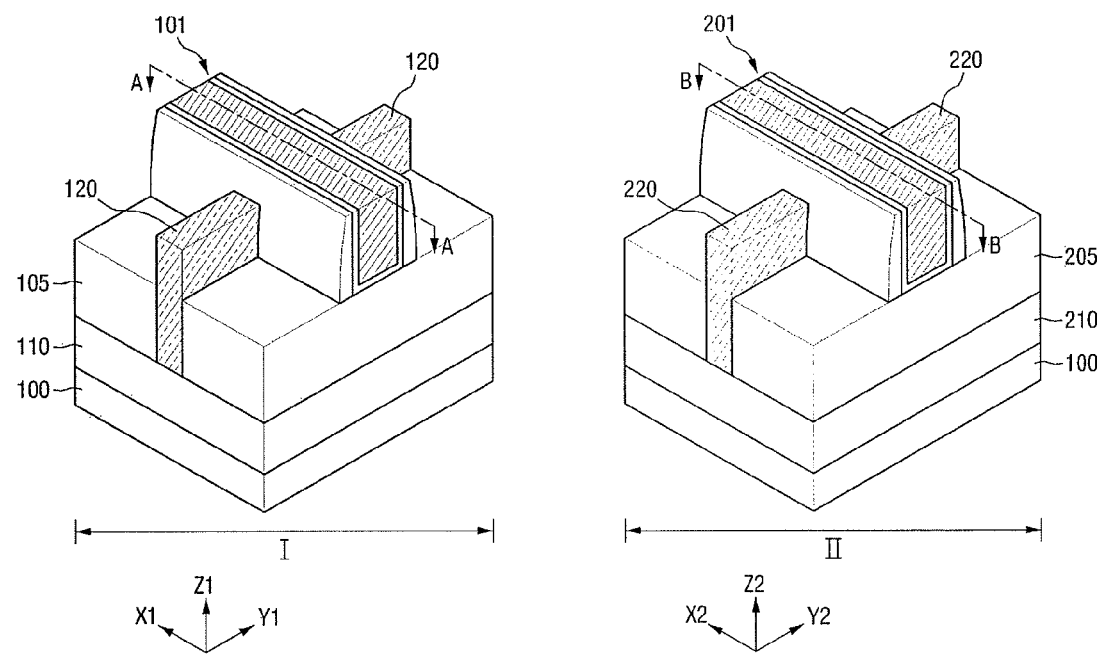
FIG. 8 illustrates a seventh embodiment of a semiconductor device.
Figure 9:
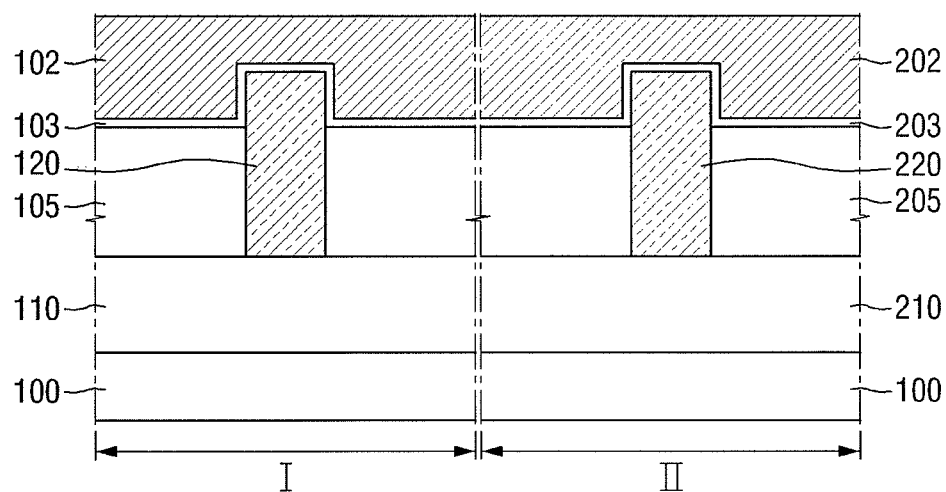
FIG. 9 illustrates a view along section lines A-A and B-B in FIG. 8.

FIG. 8 illustrates a seventh embodiment of a semiconductor device 7, which for illustrative purposes is shown to include a fin-type field transistor. FIG. 9 illustrates a cross-sectional view taken along lines A-A and B-B in FIG. 8.

Referring to FIG. 8, semiconductor device 7 includes a substrate 100, a first strain relaxed buffer layer 110, a second strain relaxed buffer layer 210, a first transistor, and a second transistor. The substrate 100 may include a first region I and a second region II. The first region I and the second region II may be areas which are spaced apart from each other, or may be areas which are connected to each other. The substrate 100 to be described below is a silicon substrate.

The first region I may include a P-type transistor region and the second region II may include an N-type transistor region. That is, the first transistor may be a P-type transistor and the second transistor may be an N-type transistor. Thus, the first transistor is formed in first region I on the first strain relaxed buffer layer 110. The second transistor is formed in second region II on the second strain relaxed buffer layer 210.

The first transistor includes a first fin-type active pattern which includes a first semiconductor pattern 120 and a first gate pattern 101. The first semiconductor pattern 120 extends in a second direction Y1 and may have a fin-type shape. The first gate pattern 101 is formed on the first semiconductor pattern 120 and extends in a first direction X1 to cross the first semiconductor pattern 120.

The second transistor includes a second fin-type active pattern which includes a second semiconductor pattern 220 and a second gate pattern 201. The second semiconductor pattern 220 extends in a second direction Y2 and may have a fin-type shape. The second gate pattern 201 is formed on the second semiconductor pattern 220 and extends in a first direction X2 to cross the second semiconductor pattern 220.

Referring to FIG. 9, semiconductor device 7 includes a first strain relaxed buffer layer 110, a second strain relaxed buffer layer 210, a first semiconductor pattern 120, and a second semiconductor pattern 220.

The first strain relaxed buffer layer 110 and second strain relaxed buffer layer 210 are formed on the substrate 100. The first strain relaxed buffer layer 110 is formed in first region I, and the second strain relaxed buffer layer 210 is formed in the second region II. The first strain relaxed buffer layer 110 and the second strain relaxed buffer layer 210 may include compound semiconductors, for example, Group IV-IV compound semiconductors or Group III-V compound semiconductors.

The first strain relaxed buffer layer 110 and second strain relaxed buffer layer 210 may be formed at the same level. Thus, in one embodiment, the first strain relaxed buffer layer 110 and the second strain relaxed buffer layer 210 may be formed by a same fabricating process. Also, in one embodiment, the first strain relaxed buffer layer 110 and the second strain relaxed buffer layer 210 may include the same compound semiconductor and have the same composition ratio.

The first semiconductor pattern 120 is formed to protrude from the first strain relaxed buffer layer 110. The first semiconductor pattern 120 may include an element semiconductor, for example, germanium. The first semiconductor pattern 120 is used as a channel layer of the first transistor, e.g., the first transistor may include a germanium channel layer.

The second semiconductor pattern 220 is formed to protrude from the second strain relaxed buffer layer 210. The second semiconductor pattern 220 may include a second Group III-V semiconductor. The second semiconductor pattern 220 may be used as a channel layer of the second transistor.

The first insulating layer pattern 105 and the second insulating layer pattern 205 are formed on the first strain relaxed buffer layer 110 and the second strain relaxed buffer layer 210, respectively. The first insulating layer pattern 105 and the second insulating layer pattern 205 may be formed at the same level.

The first insulating layer pattern 105 covers a lower portion of the first semiconductor pattern 120. The second insulating layer pattern 205 covers a lower portion of the second semiconductor pattern 220. That is, at least a part of the first semiconductor pattern 120 protrudes from the first insulating layer pattern 105, and at least a part of the second semiconductor pattern 220 protrudes from the second insulating layer pattern 205.

A first gate electrode 102 is formed on the first semiconductor pattern 120 and the first insulating layer pattern 105 to cross the first semiconductor pattern 120. A second gate electrode 202 is formed on the second semiconductor pattern 220 and the second insulating layer pattern 205 to cross the second semiconductor pattern 220.

A first gate insulating layer 103 and a second gate insulating layer 203 are respectively formed between the first gate electrode 102 and the first semiconductor pattern 120 and between the second gate electrode 202 and the second semiconductor pattern 220.

A lattice constant of the substrate 100 may be considered to correspond to a first lattice constant. Lattice constants of the first strain relaxed buffer layer 110 and the second strain relaxed buffer layer 210 may be considered to correspond to second lattice constants. A lattice constant of the first semiconductor pattern 120 may be considered to correspond to a third lattice constant. A lattice constant of the second semiconductor pattern 220 may be considered to correspond to a fourth lattice constant.

In one embodiment, the second lattice constant is greater than the first lattice constant. Also, the third lattice constant and the fourth lattice constant are greater than the second lattice constant, and the third lattice constant may have a value different from the fourth lattice constant.

In the first region I, substrate 100, first strain relaxed buffer layer 110, and first semiconductor pattern 120 may be sequentially laminated and have sequentially increasing lattice constants. In the second region II, substrate 100, second strain relaxed buffer layer 210, and second semiconductor pattern 220 may be sequentially laminated and have sequentially increasing lattice constants.

However, the lattice constants of the first semiconductor pattern 120 and the second semiconductor pattern 220 (which are used as respective channel layers of the transistor) may be different from each other. For example, the lattice constant of the first semiconductor pattern 120 may be less than the lattice constant of the second semiconductor pattern 220.

FIGS. 10 to 15 illustrate additional embodiments of semiconductor devices having fin-type field transistor shapes. In these figures, views of semiconductor devices having fin-type field transistor shapes are illustrated along section lines A-A and B-B.

Figure 10:
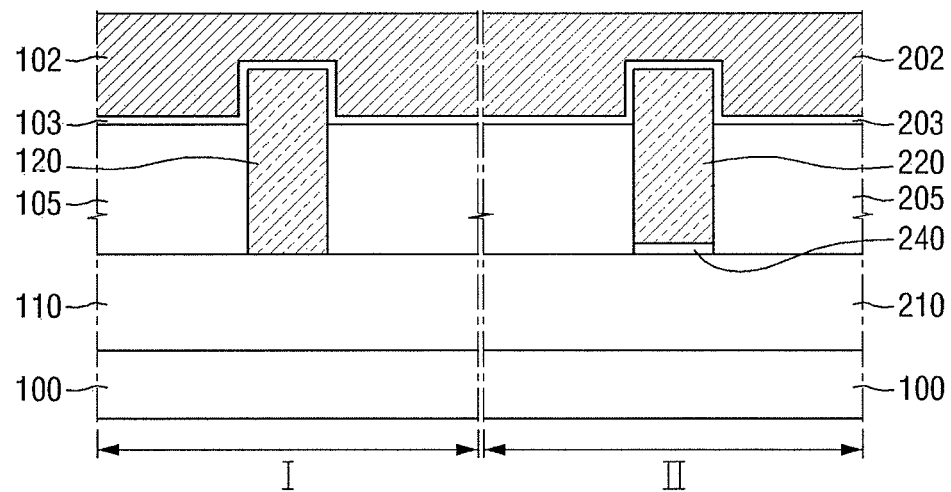
FIG. 10 illustrates an eighth embodiment of a semiconductor device.

FIG. 10 illustrates an eighth embodiment of a semiconductor device 8 which includes a first strain relaxed buffer layer 110, a second strain relaxed buffer layer 210, a first semiconductor pattern 120, a second semiconductor pattern 220, and a first buffer pattern 240. A second transistor formed in the second region II may include a first buffer pattern 240.

The first buffer pattern 240 is interposed between the second strain relaxed buffer layer 210 and the second semiconductor pattern 220. The first buffer pattern 240 includes an element semiconductor, for example, germanium. That is, the first buffer pattern 240 may be a germanium buffer pattern. The first buffer pattern 240 reduces the degree of lattice mismatch between the second strain relaxed buffer layer 210 and the second semiconductor pattern 220. As a result, the defect density of the second semiconductor pattern 220 may be reduced.

The first buffer pattern 240 may be formed at the same level as the first semiconductor pattern 120. When the first semiconductor pattern 120 is formed, a semiconductor layer including germanium may be formed on the second strain relaxed buffer layer 210. Thereafter, part of the semiconductor layer on the second strain relaxed buffer layer 210 is removed to form the first buffer pattern 240.

Figure 11:
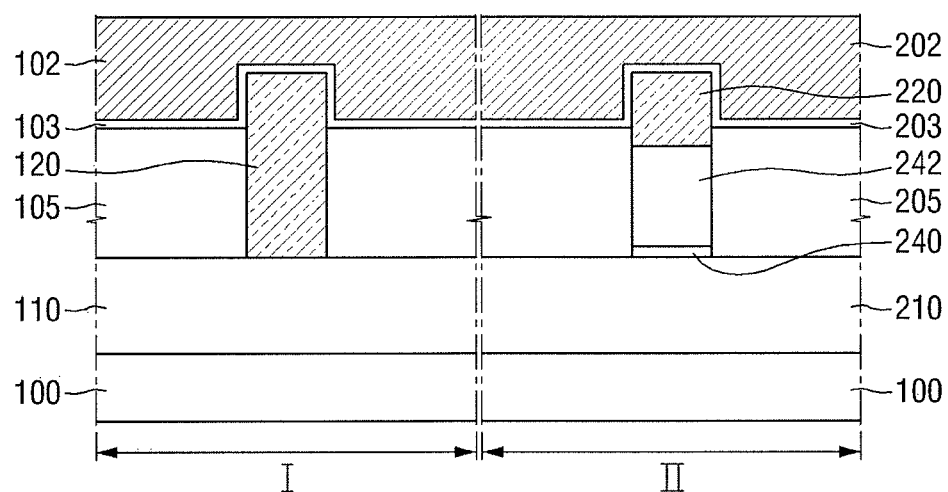
FIG. 11 illustrates a ninth embodiment of a semiconductor device.

FIG. 11 illustrates a ninth embodiment of a semiconductor device 9 which, as compared to semiconductor device 8, includes a second buffer pattern 242. In the ninth embodiment, the first buffer pattern 240 and second buffer pattern 242 are interposed between the second strain relaxed buffer layer 210 and second semiconductor pattern 220. The first and second buffer patterns 240 and 242 may be sequentially laminated on the second strain relaxed buffer layer 210.

The first buffer pattern 240 and the second buffer pattern 242 may include different materials. For example, the first buffer pattern 240 may include germanium which is an element semiconductor. The second buffer pattern 242 may include a compound semiconductor. The second buffer pattern 242 includes, for example, a first Group III-V semiconductor. As illustrated in FIG. 10, the first buffer pattern 240 may be formed at the same level as the first semiconductor pattern 120.

The first Group III-V semiconductor in the second buffer pattern 242 may include a different material from the second Group III-V semiconductor in the second semiconductor pattern 220. Alternatively, the first Group III-V semiconductor may have a different composition even though the first Group III-V semiconductor includes the same material as the second Group III-V semiconductor. An energy band gap of the first Group III-V semiconductor in the second buffer pattern 242 may be greater than an energy band gap of the second Group III-V semiconductor included in the second semiconductor pattern 220.

In semiconductor device 9, the first buffer pattern 240 is interposed between the second semiconductor pattern 220 and the second strain relaxed buffer layer 210, but this is not necessary. That is, the first buffer pattern 240 may not be interposed between the second semiconductor pattern 220 and the second strain relaxed buffer layer 210.

Figure 12:
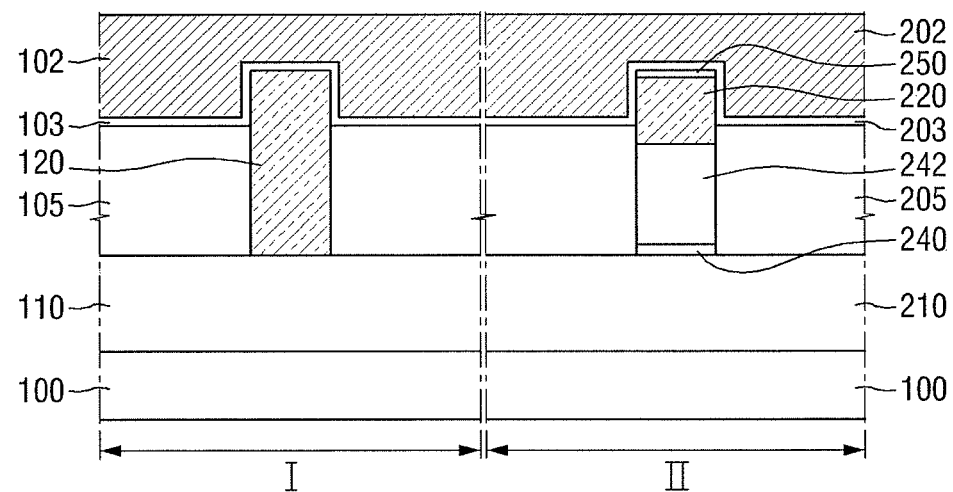
FIG. 12 illustrates a tenth embodiment of a semiconductor device.

FIG. 12 illustrates a tenth embodiment of a semiconductor device 10 which, as compared with semiconductor device 9, includes a capping pattern 250. The capping pattern 250 is formed between the second semiconductor pattern 220 and the second gate electrode 202, e.g., the capping pattern 250 is formed on the second semiconductor pattern 220.

The capping pattern 250 may include a compound semiconductor, for example, a third Group III-V semiconductor. The third Group III-V semiconductor in the capping pattern 250 may include a material different from a second Group III-V semiconductor included in the second semiconductor pattern 220. Alternatively, the third Group III-V semiconductor may have a different composition even though the third Group III-V semiconductor have the same material as the second Group III-V semiconductor.

In semiconductor device 10, a second energy band gap of the second Group III-V semiconductor in the second semiconductor pattern 220 may be less than a first energy band gap of the first Group III-V semiconductor in the second buffer pattern 242 and a third energy band gap of the third Group III-V semiconductor in the capping pattern 250.

Also, in semiconductor device 10, the first buffer pattern 240 and the second buffer pattern 242 may be interposed between the second semiconductor pattern 220 and the second strain relaxed buffer layer 210, but this is not necessary. That is, the first buffer pattern 240 and/or the second buffer pattern 242 may not be interposed between the second semiconductor pattern 220 and the second strain relaxed buffer layer 210.

Figure 13:
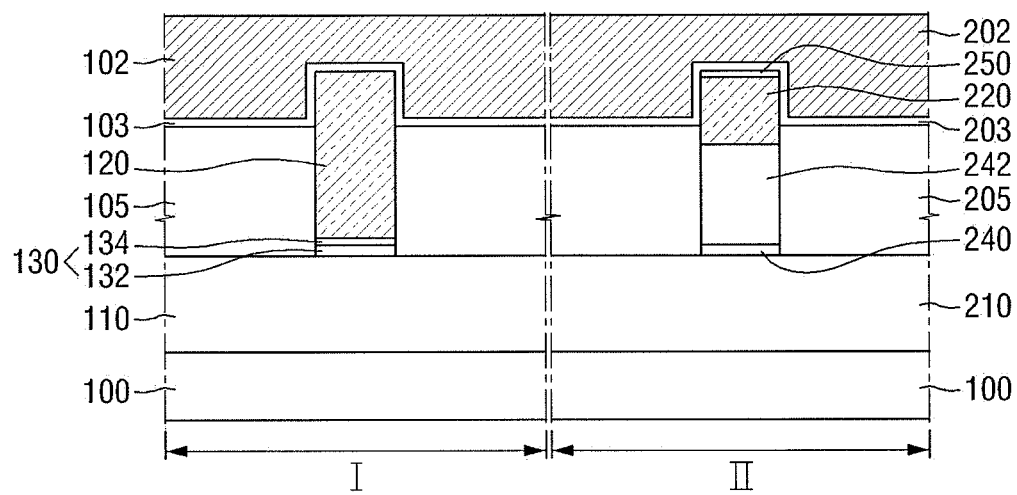
FIG. 13 illustrates an eleventh embodiment of a semiconductor device.

FIG. 13 illustrates an eleventh embodiment of a semiconductor device 11 which, as compared with the semiconductor device 10, includes a first insertion pattern 130. The first insertion pattern 130 is formed between the first semiconductor pattern 120 and the first strain relaxed buffer layer 110. The first insertion pattern 130 includes a first lower insertion pattern 132 and a first upper insertion pattern 134.

The first lower insertion pattern 132 may include an element semiconductor, for example, germanium. The first upper insertion pattern 134 includes a material having a high etching selectivity to the first semiconductor pattern 120. The first lower insertion pattern 132 of the first insertion pattern 130 may be formed at the same level as the first buffer pattern 240. Also, in semiconductor device 11, at least one of the first buffer pattern 240, the second buffer pattern 242, and the capping pattern 250 may not be formed.

Figure 14:
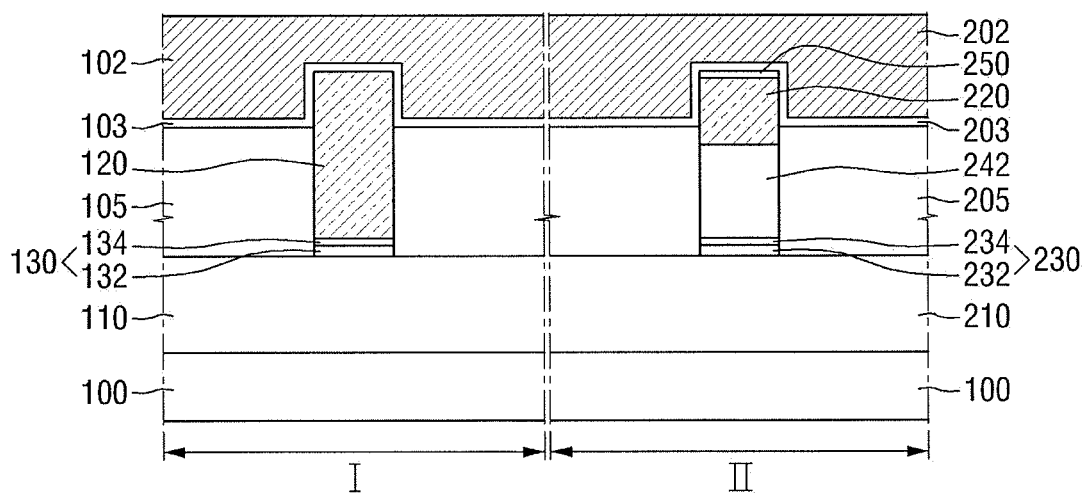
FIG. 14 illustrates a twelfth embodiment of a semiconductor device.

FIG. 14 illustrates a twelfth embodiment of a semiconductor device 12 which includes a second insertion pattern 230, but which does not include a first buffer pattern 240 compared with the semiconductor device 11. The second insertion pattern 230 is formed between the second buffer pattern 242 and second strain relaxed buffer layer 210.

The second insertion pattern 230 includes a second lower insertion pattern 232 and a second upper insertion pattern 234. The second insertion pattern 230 may be formed at the same level as the first insertion pattern 130. The second lower insertion pattern 232 may include an element semiconductor, for example, germanium. The second upper insertion pattern 234 includes a material having a high etching selectivity to the first semiconductor pattern 120. Also, in semiconductor device 12, at least one of the second buffer pattern 242 and the capping pattern 250 may not be formed.

Figure 15:
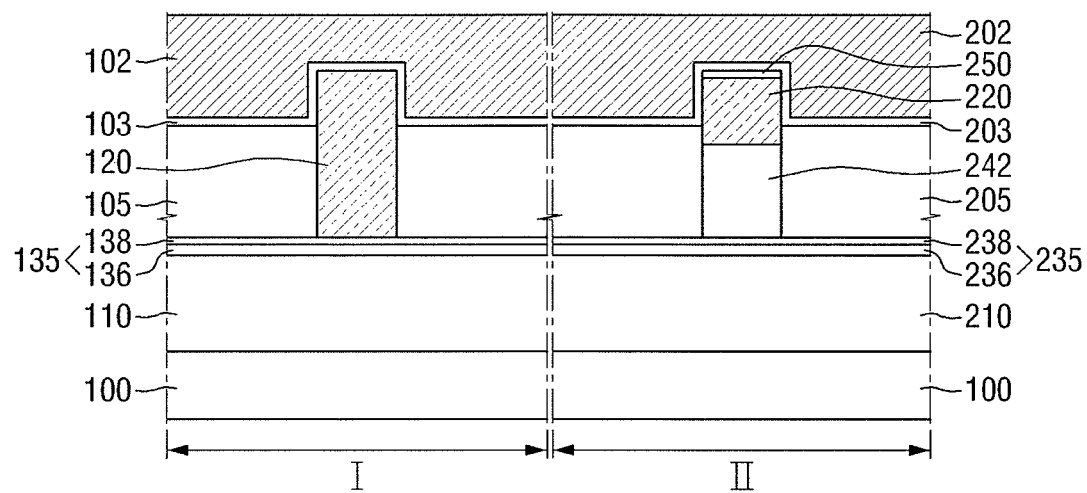
FIG. 15 illustrates a thirteenth embodiment of a semiconductor device.

FIG. 15 illustrates a thirteenth embodiment of a semiconductor device 13 which includes a first strain relaxed buffer layer 110, a second strain relaxed buffer layer 210, a first insertion layer 135, a second insertion layer 235, a first semiconductor pattern 120, a second semiconductor pattern 220, a second buffer pattern 242, and a capping pattern 250.

A first insulating layer pattern 105 and the first semiconductor pattern 120 are formed on the first insertion layer 135. A second insulating layer pattern 205 and the second semiconductor pattern 220 are formed on the second insertion layer 235. That is, respective widths of the first insertion layer 135 and the second insertion layer 235 are larger than widths of the first semiconductor pattern 120 and second buffer pattern 242.

The first insertion layer 135 includes a first lower insertion layer 136 and a first upper insertion layer 138. The second insertion layer 235 includes a second lower insertion layer 236 and a second upper insertion layer 238. The first insertion layer 135 and the second insertion layer 235 are formed at the same level.

The first lower insertion layer 136 and the second lower insertion layer 236 may include germanium which is an element semiconductor. The first upper insertion layer 138 and the second upper insertion layer 238 may include a material having a high etching selectivity to the germanium element semiconductor.

Also, in semiconductor device 13, at least one of the second buffer pattern 242 and the capping pattern 250 may not be formed. Further, the second buffer pattern 242 may be formed to contact the second upper insertion layer 238, but this is not necessary. That is, part of the second upper insertion layer 238 may be removed. As a result, the second buffer pattern 242 may be formed to contact second lower insertion layer 236.

In semiconductor devices 7 to 13, a lattice mismatch may exist between substrate 100 and first strain relaxed buffer layer 110, and between substrate 100 and second strain relaxed buffer layer 210. As a result, defects (for example, dislocation) may be generated between substrate 100 and the first strain relaxed buffer layer 110, and between substrate 100 and the second strain relaxed buffer layer 210. That is, the defects may be entirely generated on and confined to substrate 100.

Further, because the first semiconductor pattern 120 in first region I may be formed at a critical thickness or less, an additional defect may be not be or only slightly generated between the first strain relaxed buffer layer 110 and the first semiconductor pattern 120. However, even though buffer patterns 240 and 242 reduce lattice mismatch between the second semiconductor pattern 220 in the second region II and the second strain relaxed buffer layer 210, an additional defect may be generated between the second semiconductor pattern 220 and the second strain relaxed buffer layer 210. Accordingly, the defect density in the second semiconductor pattern 220 may be greater than the defect density in the first semiconductor pattern 120 in certain cases.

Figure 16:
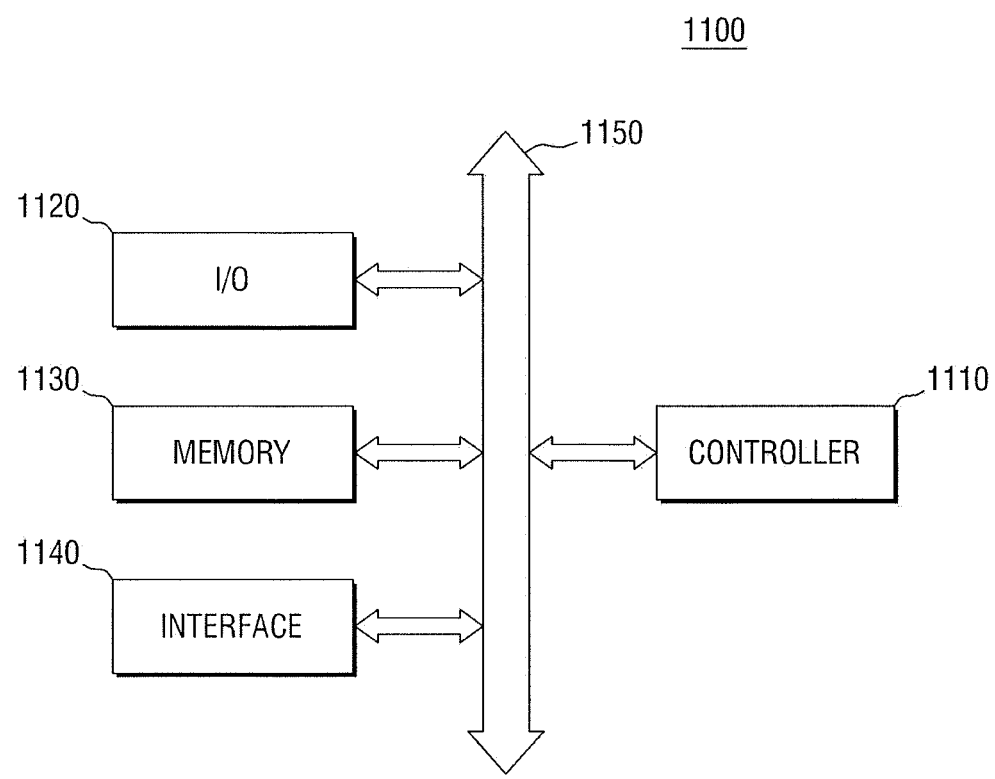
FIG. 16 illustrates an embodiment of an electronic system.

FIG. 16 illustrates an embodiment of an electronic system 1100 that includes one or more semiconductor devices corresponding to one or more of the aforementioned embodiments. Referring to FIG. 16, electronic system 1100 includes a controller 1110, an input/output device I/O 1120, a memory device 1130, an interface 1140, and a bus 1150. The controller 1110, the input/output device 1120, the memory device 1130, and/or the interface 1140 may be coupled with each other through the bus 1150. The bus 1150 corresponds to a path through which data move.

The controller 1110 may include at least one of a microprocessor, a digital signal processor, a microcontroller, or logic elements which may perform functions similar to the microprocessor, the digital signal processor, and the microcontroller. The input/output device 1120 may include a keypad, a keyboard, a display device, or the like. The memory device 1130 may store data and/or commands. The interface 1140 may perform functions which include transmitting data to a communication network and/or receiving data from the communication network. The interface 1140 may include a wired or wireless interface, or both. For example, interface 1140 may include an antenna, a wired and wireless transceiver, or the like.

The electronic system 1100 may further include a high-speed DRAM and/or SRAM, as an operational memory for improving an operation of the controller 1110. One or more of the aforementioned semiconductor device embodiments may be provided in memory device 1130, and/or may be provided as a part of controller 1110, the input/output device I/O 1120, or the like.

The electronic system 1100 may correspond to or be included in a personal digital assistant (PDA), a portable computer, a web tablet, a wireless phone, a mobile phone, a digital music player, a memory card, or other types of electronic products capable of transmitting and/or receiving information in a wireless environment.

Figure 17:
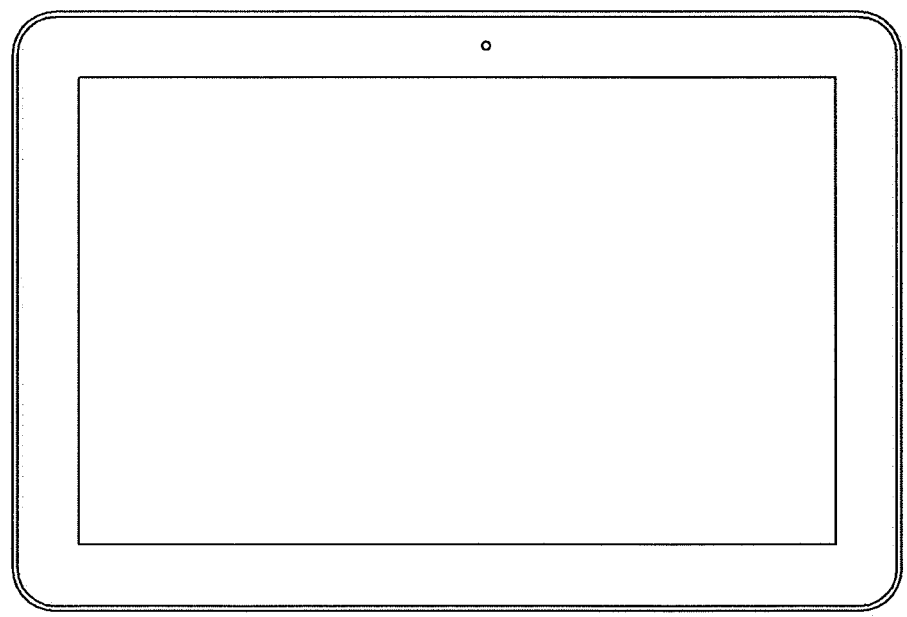
FIGS. 17 and 18 illustrate embodiments of semiconductor systems.
Figure 18:
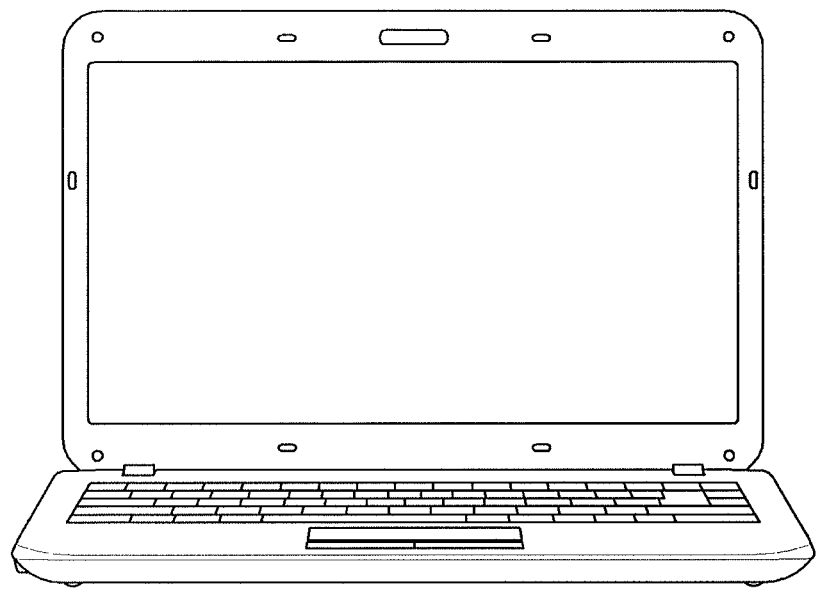

FIGS. 17 and 18 illustrate examples of semiconductor systems which may include one or more of the aforementioned semiconductor device embodiments. FIG. 17 illustrates a tablet PC, and FIG. 18 illustrates a laptop computer. At least one of semiconductor devices 1 to 13 may be used in the tablet PC or laptop computer.

Figure 19:
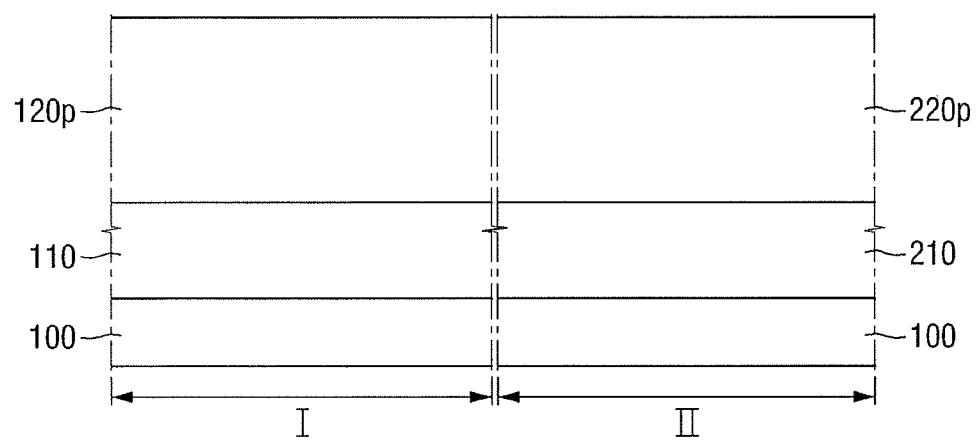
FIGS. 19-22 illustrate a first embodiment of a method for making a semiconductor device.

FIGS. 19 to 22 illustrate operations included in a first embodiment of a method for fabricating a semiconductor device. The semiconductor device may be the one in FIG. 12. Referring to FIG. 19, a first strain relaxed buffer layer 110 and a second strain relaxed buffer layer 210 are simultaneously formed on a substrate 100 including a first region I and a second region II. That is, the first strain relaxed buffer layer 110 is formed in the first region I, and the second strain relaxed buffer layer 210 is formed in the second region II.

Thereafter, a first semiconductor layer 120p and a second semiconductor layer 220p including element semiconductors are formed on the first strain relaxed buffer layer 110 and the second strain relaxed buffer layer 210, respectively.

The first semiconductor layer 120p and second semiconductor layer 220p may be simultaneously formed. More specifically, the first strain relaxed buffer layer 110 and the strain relaxed buffer layer 210 are formed on the substrate 100. The first strain relaxed buffer layer 110 and the second strain relaxed buffer layer 210 may include compound semiconductors, and for example, Group IV-IV compound semiconductors or Group III-V compound semiconductors. The first strain relaxed buffer layer 110 and the second strain relaxed buffer layer 210 may be formed by using an epitaxial growth method. For example, layers 110 and 210 may be formed by a chemical vapor deposition (CVD) method.

The first semiconductor layer 120p and the second semiconductor layer 220p are formed on the first strain relaxed buffer layer 110 and the second strain relaxed buffer layer 210. The first semiconductor layer 120p and the second semiconductor layer 220p include element semiconductors, for example, germanium single crystal layers. The first semiconductor layer 120p and the second semiconductor layer 220p may be formed by using an epitaxial growth method. For example, layers 120p and 220p may be formed by a chemical vapor deposition (CVD) method.

Figure 20:
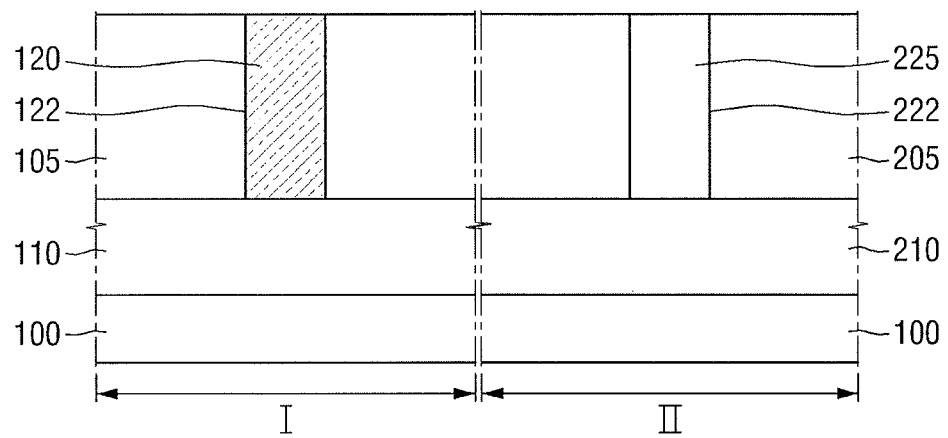
Figure 22:
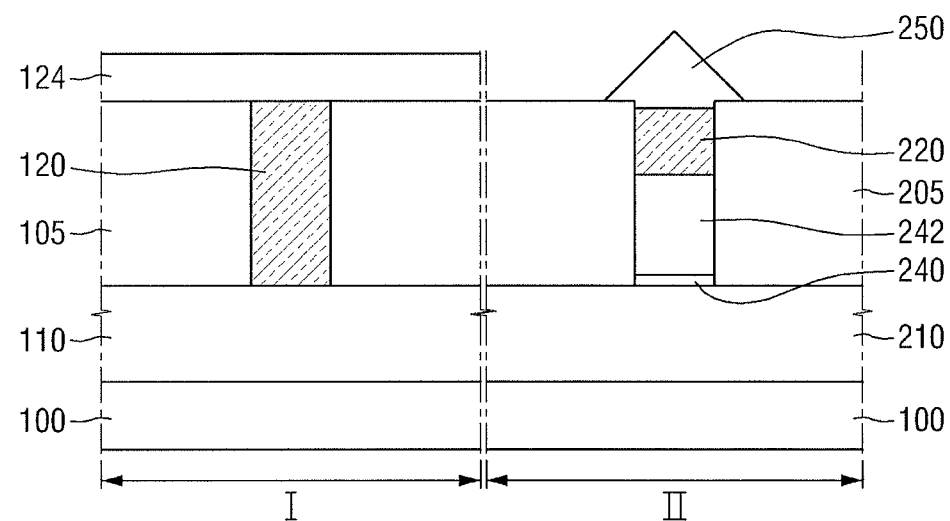

Referring to FIG. 20, a first trench 122 is formed in the first semiconductor layer 120p by patterning the first semiconductor layer 120p. A second trench 222 is formed in the second semiconductor layer 220p by patterning the second semiconductor layer 220p. The first trench 122 and the second trench 222 may expose the first strain relaxed buffer layer 110 and the second strain relaxed buffer layer 210, respectively. The first trench 122 and the second trench 222 may be formed, for example, by an etching process. In FIG. 22, bottoms of the first trench 122 and the second trench 222 are shown to be placed on the same plane as upper surfaces of the first strain relaxed buffer layer 110 and the second strain relaxed buffer layer 210, but this is not necessary.

Thereafter, the first trench 122 and second trench 222 are filled with insulating material to form a first insulating layer pattern 105 and a second insulating layer pattern 205. Forming the first insulating layer pattern 105 and the second insulating layer pattern 205 allows a first semiconductor pattern 120 to be formed in first region I and a dummy semiconductor pattern 225 to be formed in second region II. That is, first semiconductor pattern 120 is formed on the first strain relaxed buffer layer 110. The first insulating layer pattern 105 and the second insulating layer pattern 205 may be formed, for example, by a chemical vapor deposition method.

Figure 21:
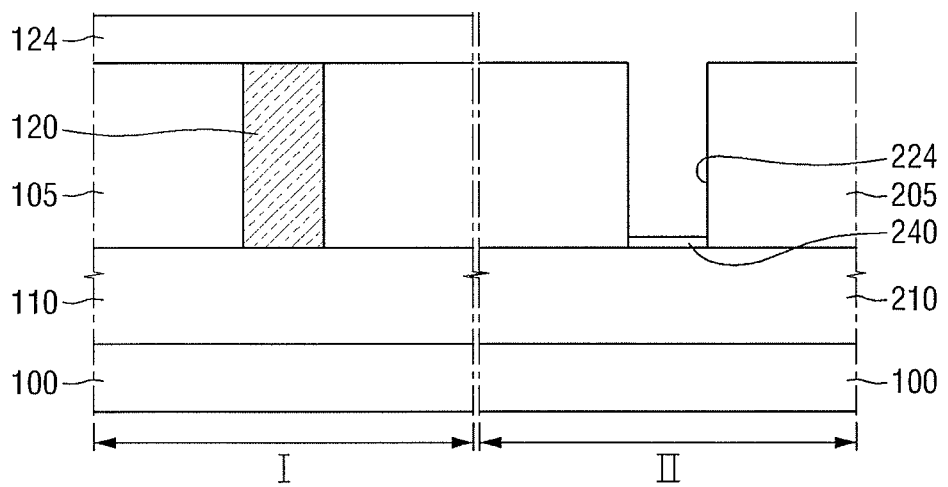

Referring to FIG. 21, a mask pattern 124 is formed on the first insulating layer pattern 105. The mask pattern 124 may cover first region I and may expose second region II. That is, the first semiconductor pattern 120 may be covered by mask pattern 124, but the dummy semiconductor pattern 225 may be exposed by mask pattern 124.

Thereafter, the dummy semiconductor pattern 225 is removed using the mask pattern 124 as an etching mask. A third trench 224 is formed in second region II, by removing the second semiconductor layer 220p patterned between the second insulating layer patterns 205, that is, the dummy semiconductor pattern 225. The third trench 224 may be formed, for example, by a wet-etching process. An etchant used in the wet-etching process may have, for example, a high etching selectivity of germanium relative to the second insulating layer patterns 205.

When the dummy semiconductor pattern 225 is removed, part of the dummy semiconductor pattern 225 may remain on a bottom of the third trench 224. That is, the second strain relaxed buffer layer 210 is not exposed. Accordingly, the first buffer pattern 240 may be formed on the bottom of the third trench 224.

In the first method embodiment, the second strain relaxed buffer layer 210 may not be exposed by the third trench 224, but this is not necessary. That is, part of the dummy semiconductor pattern 225 may remain on the bottom of the third trench 224. Thus, the first buffer pattern 240 may not be formed, and the second strain relaxed buffer layer 210 may be exposed by fully removing dummy semiconductor pattern 225.

Referring to FIG. 22, the second buffer pattern 242, the second semiconductor pattern 220, and the capping pattern 250 are sequentially formed in the third trench 224. The first buffer pattern 240 may include a first Group III-V semiconductor, the second semiconductor pattern 220 may include a second Group III-V semiconductor, and the capping pattern 250 may include a third Group III-V semiconductor.

The second buffer pattern 242, the second semiconductor pattern 220, and the capping pattern 250 may be formed, for example, by an epitaxial growth method, e.g., a chemical vapor deposition (CVD) method.

Thereafter, the mask pattern 124 and the capping pattern 250 protruding from the second insulating layer pattern 205 are removed, for example, by a planarization process. After the planarization process, gate electrodes are formed on the first semiconductor pattern 120 and second semiconductor pattern 220 to fabricate the transistor.

In the first method embodiment, the second buffer pattern 242 may be formed between the second semiconductor pattern 220 and the first buffer pattern 240, but this is not necessary. That is, the second semiconductor pattern 220 may be formed to contact the first buffer pattern 240.

In the first method embodiment, the capping pattern 250 may be formed on the second semiconductor pattern 220, but this is not necessary. That is, the capping pattern 250 may not be formed on the second semiconductor pattern 220.

FIGS. 23 to 26 illustrates operations included in a second embodiment of a method for fabricating a semiconductor device. This semiconductor device may be the one in FIG. 14.

Figure 23:
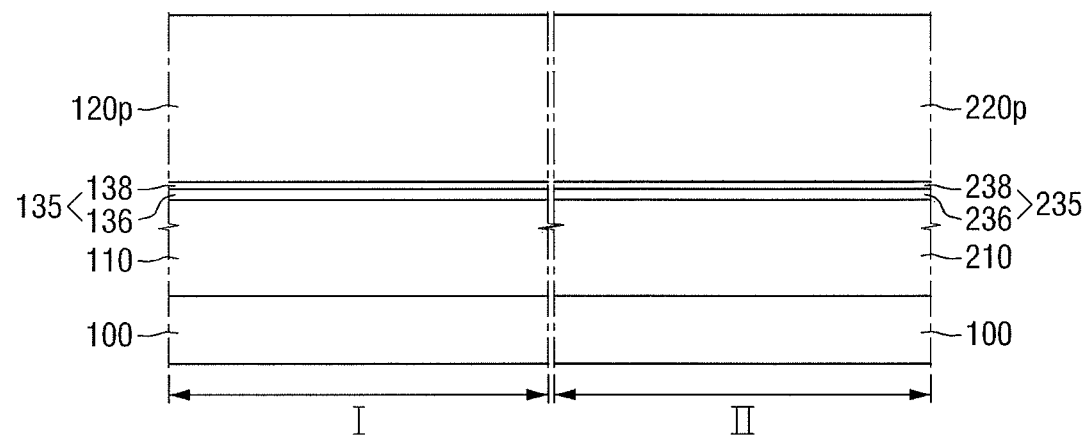
FIGS. 23-26 illustrate a second embodiment of a method for making a semiconductor device.

Referring to FIG. 23, a first strain relaxed buffer layer 110 and a second strain relaxed buffer layer 210 are simultaneously formed on a substrate 100 which includes a first region I and a second region II. The first strain relaxed buffer layer 110 and the second strain relaxed buffer layer 210 may be formed, for example, by an epitaxial growth method, e.g., a chemical vapor deposition (CVD) method.

A first insertion layer 135 and a second insertion layer 235 are simultaneously formed on the first strain relaxed buffer layer 110 and the second strain relaxed buffer layer 210. The first insertion layer 135 and the second insertion layer 235 include a first lower insertion layer 136 and a second lower insertion layer 236 which include germanium as element semiconductors, respectively.

The first insertion layer 135 and the second insertion layer 235 include a first upper insertion layer 138 and a second upper insertion layer 238 which include a material having an etching selectivity relative to germanium, for example, SiGeC. The first upper insertion layer 138 and the second upper insertion layer 238 may serve as an etching stop layer in a subsequent process. The first insertion layer 135 and the second insertion layer 235 may be formed, for example, by an epitaxial growth method, e.g., a chemical vapor deposition (CVD) method.

Thereafter, the first semiconductor layer 120p and the second semiconductor layer 220p are formed on the first insertion layer 135 and the second insertion layer 235. The first semiconductor layer 120p and the second semiconductor layer 220p include element semiconductors, for example, germanium single crystal layers. The first semiconductor layer 120p and the second semiconductor layer 220p may be formed, for example, by an epitaxial growth method.

Figure 24:
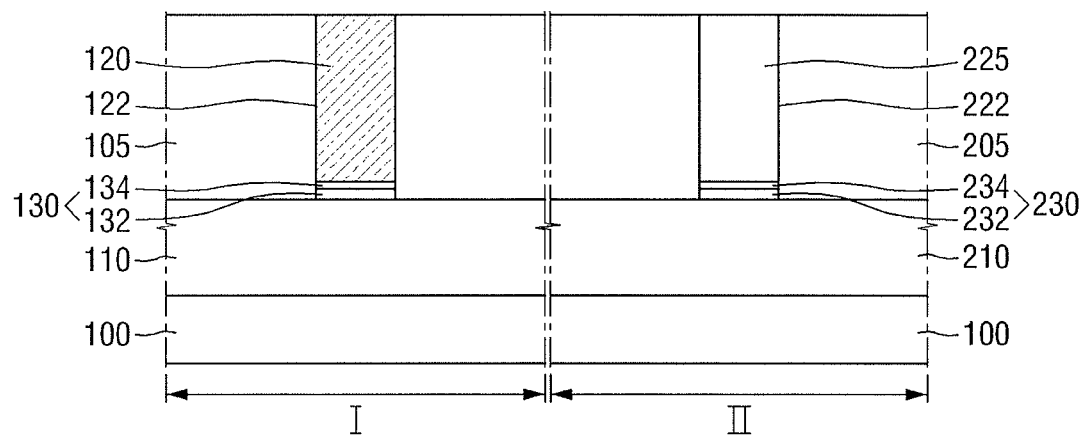

Referring to FIG. 24, a first trench 122 is formed in the first semiconductor layer 120p and the first insertion layer 135 by patterning the first semiconductor layer 120p and the first insertion layer 135. A second trench 222 is formed in the second semiconductor layer 220p and the second insertion layer 235 by patterning the second semiconductor layer 220p and the second insertion layer 235. The first trench 122 and the second trench 222 are formed to pass through the first insertion layer 135 and the second insertion layer 235 to expose the first strain relaxed buffer layer 110 and the second strain relaxed buffer layer 210.

Thereafter, the first trench 122 and second trench 222 are filled with insulating material to form a first insulating layer pattern 105 and a second insulating layer pattern 205. By forming the first insulating layer pattern 105 and the second insulating layer pattern 205, the first insertion pattern 130 and the first semiconductor pattern 120 are formed in the first region I, and the dummy semiconductor pattern 225 and the second insertion pattern 230 are formed in the second region II.

Figure 25:
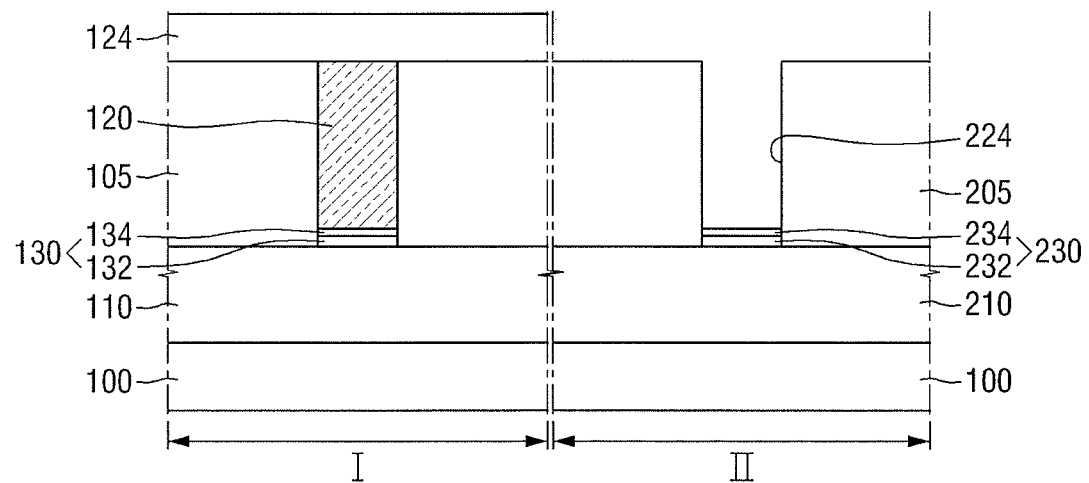

Referring to FIG. 25, the mask pattern 124 exposing the second region II is formed on the first insulating layer pattern 105. The dummy semiconductor pattern 225 is exposed by the mask pattern 124.

Thereafter, a third trench 224 is formed in the second region II, by removing the second semiconductor layer 220p patterned between the second insulating layer patterns 205, that is, the dummy semiconductor pattern 225. The third trench 224 exposes the second upper insertion pattern 234. The third trench 224 may be formed, for example, by a wet-etching process. An etchant used in the wet-etching process may have a high etching selectivity of germanium relative to the second insulating layer patterns 205. Further, the etchant used in the wet-etching process may have a high etching selectivity of germanium relative to the second upper insertion pattern 234.

In the second method embodiment, the second upper insertion pattern 234 may remain, but this is not necessary. After removing the dummy semiconductor pattern 225, the second upper insertion pattern 234 is removed to expose the second lower insertion pattern 232, using an etchant having a high etching selectivity of the second upper insertion pattern 234 to germanium.

Figure 26:
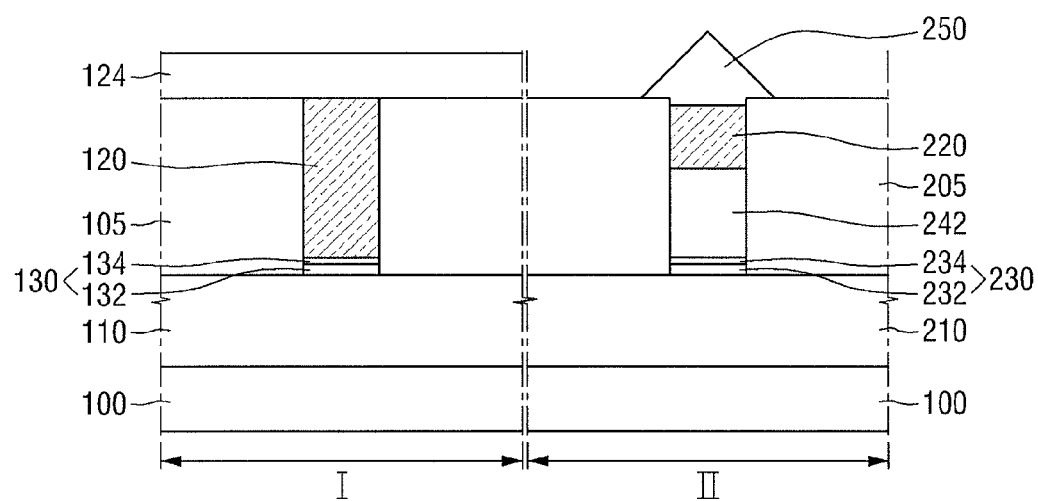

Referring to FIG. 26, the second buffer pattern 242, the second semiconductor pattern 220, and the capping pattern 250 are sequentially formed in the third trench 224. Thereafter, the mask pattern 124 and capping pattern 250 protruding from the second insulating layer pattern 205 are removed by a planarization process. After the planarization process, gate electrodes are formed on the first semiconductor pattern 120 and the second semiconductor pattern 220 to fabricate the transistor.

In the second method embodiment, the second buffer pattern 242 is formed between the second semiconductor pattern 220 and the second upper insertion pattern 234, but this is not necessary. The second buffer pattern 242 may not be formed.

In the second method embodiment, the capping pattern 250 may be formed on the second semiconductor pattern 220, but this is not necessary. That is, the capping pattern 250 may not be formed on the second semiconductor pattern 220.

Figure 27:
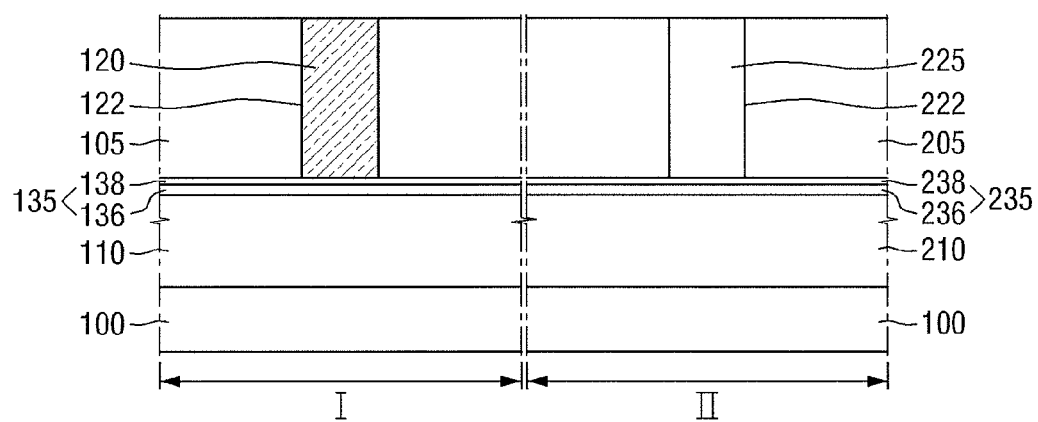
FIG. 27 illustrates a third embodiment of a method for making a semiconductor device.

FIGS. 23 to 27 illustrate operations included in a third embodiment of a method for fabricating a semiconductor device. The semiconductor device may be the one in FIG. 15. Referring to FIG. 27, a first trench 122 is formed in the first semiconductor layer 120p by patterning the first semiconductor layer 120p. A second trench 222 is formed in the second semiconductor layer 220p by patterning the second semiconductor layer 220p. The first trench 122 and the second trench 222 may expose a first upper insertion layer 138 and a second upper insertion layer 238, respectively.

Thereafter, the first trench 122 and second trench 222 are filled with insulating material to form a first insulating layer pattern 105 and a second insulating layer pattern 205. As a result, the first semiconductor pattern 120 is formed on the first insertion layer 135, and the dummy semiconductor pattern 225 is formed on the second insertion layer 235. Subsequently, the dummy semiconductor pattern 225 is removed, and the second semiconductor pattern 220 may be formed at a site where the dummy semiconductor pattern 225 is removed.

In accordance with one or more of the aforementioned embodiments, a semiconductor device achieves improved operational performance by using germanium and compound semiconductors for a transistor channel layer. In these or other embodiments, a semiconductor device achieves improved defect density by using germanium and compound semiconductors for a transistor channel layer. In other embodiments, a method for fabricating a semiconductor device uses germanium and compound semiconductors for a channel layer of a transistor.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first region and a second region;
   a silicon-germanium layer on the substrate;
   a first semiconductor pattern on the silicon-germanium layer of the first region, the first semiconductor pattern including an element semiconductor;
   a second semiconductor pattern on the silicon-germanium layer of the second region, the second semiconductor pattern including a Group III-V semiconductor material, and
   a germanium buffer pattern between the second semiconductor pattern and the silicon-germanium layer of the second region, wherein the first semiconductor pattern includes germanium, wherein a bottom surface of the first semiconductor pattern and a bottom surface of the germanium buffer pattern are on a top surface of the silicon-germanium layer, and wherein a height from a top surface of the substrate to a top surface of the first semiconductor pattern is greater than a height from the top surface of the substrate to a top surface of the germanium buffer pattern.

2. The semiconductor device as claimed in claim 1, further comprising: a buffer pattern between the silicon-germanium layer and the germanium buffer pattern, wherein the buffer pattern includes a Group III-V semiconductor material.

3. The semiconductor device as claimed in claim 1, further comprising:
   a capping pattern on the second semiconductor pattern.

4. The semiconductor device as claimed in claim 3, wherein the capping pattern includes a Group III-V semiconductor material.

5. The semiconductor device as claimed in claim 3, wherein:
   the capping pattern includes a first energy band gap, and
   the second semiconductor pattern includes a second energy band gap which is less than the first energy band gap.

6. The semiconductor device as claimed in claim 1, further comprising: a first insertion pattern between the first semiconductor pattern and the silicon-germanium layer.

7. The semiconductor device as claimed in claim 6, further comprising:
   a second insertion pattern between the germanium buffer pattern and the second semiconductor pattern, wherein the first insertion pattern and the second insertion pattern are at a same level.

8. The semiconductor device as claimed in claim 1, further comprising:
   an insertion layer on the silicon-germanium layer,
   wherein the first semiconductor pattern and the second semiconductor pattern are on the insertion layer.

9. The semiconductor device as claimed in claim 1, wherein:
   the substrate is a silicon substrate.

10. A semiconductor device, comprising:
    a silicon substrate including a first region and a second region;
    a silicon-germanium layer on the silicon substrate;
    a first transistor on the silicon-germanium layer in the first region; and
    a second transistor on the silicon-germanium layer in the second region, wherein the first transistor includes a germanium channel layer on the silicon-germanium layer and a first gate electrode on and crossing the germanium channel layer, wherein the second transistor includes a first buffer pattern including germanium on the silicon-germanium layer, a Group III-V semiconductor channel layer including a first Group III-V semiconductor material on the first buffer pattern, and a second gate electrode crossing the Group III-V semiconductor channel layer on the Group III-V semiconductor channel layer, and wherein a height from a top surface of the silicon substrate to a top surface of the germanium channel layer is greater than a height from the top surface of the silicon substrate to a top surface of the first buffer pattern.

11. The semiconductor device as claimed in claim 10, wherein:
    the first transistor includes a first insertion pattern between the germanium channel layer and the silicon-germanium layer,
    the second transistor includes a second insertion pattern between the first buffer pattern and the Group III-V semiconductor channel layer, and
    the first insertion pattern and the second insertion pattern are at a same level.

12. The semiconductor device as claimed in claim 10, further comprising:
    a second buffer pattern between the Group III-V semiconductor channel layer and the first buffer pattern, wherein the second buffer pattern includes a second Group III-V semiconductor material having an energy band gap greater than an energy band gap of the first Group III-V semiconductor material.

13. The semiconductor device as claimed in claim 10, further comprising:
    a capping pattern between the Group III-V semiconductor channel layer and the second gate electrode, wherein the capping pattern includes a third Group III-V semiconductor material having an energy band gap greater than an energy band gap of the first Group III-V semiconductor.

* * * * *